US006608874B1

(12) United States Patent
Beidas et al.

(10) Patent No.: US 6,608,874 B1
(45) Date of Patent: *Aug. 19, 2003

(54) METHOD AND APPARATUS FOR QUADRATURE MULTI-PULSE MODULATION OF DATA FOR SPECTRALLY EFFICIENT COMMUNICATION

(75) Inventors: Bassel F. Beidas, Alexandria, VA (US); A. Roger Hammons, Jr., North Potomac, MD (US)

(73) Assignee: Hughes Electronics Corporation, El Segundo, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/005,469

(22) Filed: Jan. 12, 1998

(51) Int. Cl.[7] ............................................... H03K 7/02
(52) U.S. Cl. .................. 375/353; 375/261; 375/280; 375/298; 375/324; 375/331
(58) Field of Search ................. 375/261, 353, 375/280, 324, 206, 130, 232, 233, 235, 298, 331; 370/529

(56) References Cited

U.S. PATENT DOCUMENTS

| | | | | |
|---|---|---|---|---|
| 4,730,344 A | * | 3/1988 | Saha | 375/280 |
| 5,583,892 A | * | 12/1996 | Drakul et al. | 375/353 |
| 5,640,423 A | * | 6/1997 | Archer | 375/261 |
| 6,055,266 A | * | 4/2000 | Nakamura | 375/206 |

OTHER PUBLICATIONS

Osama et al., Differential Detection in Quadrature–Quadrature Phase Shift Keying System, IEEE, pp. 703–712, Jun. 1991.*

* cited by examiner

Primary Examiner—Shuwang Liu
(74) Attorney, Agent, or Firm—John T. Whelan; Michael Sales

(57) ABSTRACT

A modulator produces a modulated signal including a carrier and data signals representing data bits. The data signals include at least two in-phase modulating pulses which have different shapes and which are interfering in time and frequency; the data signals further include at least two quadrature modulating pulses which have different shapes and which are interfering in time and frequency. The modulator includes a filter for producing each shape of pulse, and combining circuits for combining the pulses with each other and with a carrier. The demodulator (or receiver) receives the combined signal and separates the pulses from the carrier. The demodulator further includes filters for separating the pulses, and a circuit for processing the pulses to reproduce the data bits. The processing circuit preferably includes one or more maximum likelihood sequence estimation equalizers.

7 Claims, 15 Drawing Sheets

FIG. 13

Flowchart of the Efficient MSLE Algorithm for QMP

Step 1: Beginning at time 2T, compute the likelihood metric for the paths between the initial state and each of the $2^{K_{eq}M}$ states $K_{eq}$ levels deep into the trellis.

Step 2: Increase time by 2T. Compute the partial metric for all the paths entering a state by adding branch metric entering that state to the metric of the connecting survivor at the preceding time unit, or $J_{i,n}$ $(a_{1,n}, a_{2,n}, a_{3,n}, \ldots, a_{M,n})$ defined in Eq. (44). (Each state can be reached from only $2^M$ previous states.) For each state, retain the path with the largest metric, together with its metric, and eliminate all other $2^M$ paths.

Step 3: If time is <2T* (sequence length + coding delay) then repeat Step 2. Otherwise, stop.

Step 4: Once all state values have been computed, start at the final state, time=2T* (sequence length + coding delay), and follow the surviving branches backward through the trellis. This path corresponds to the most likely sequence.

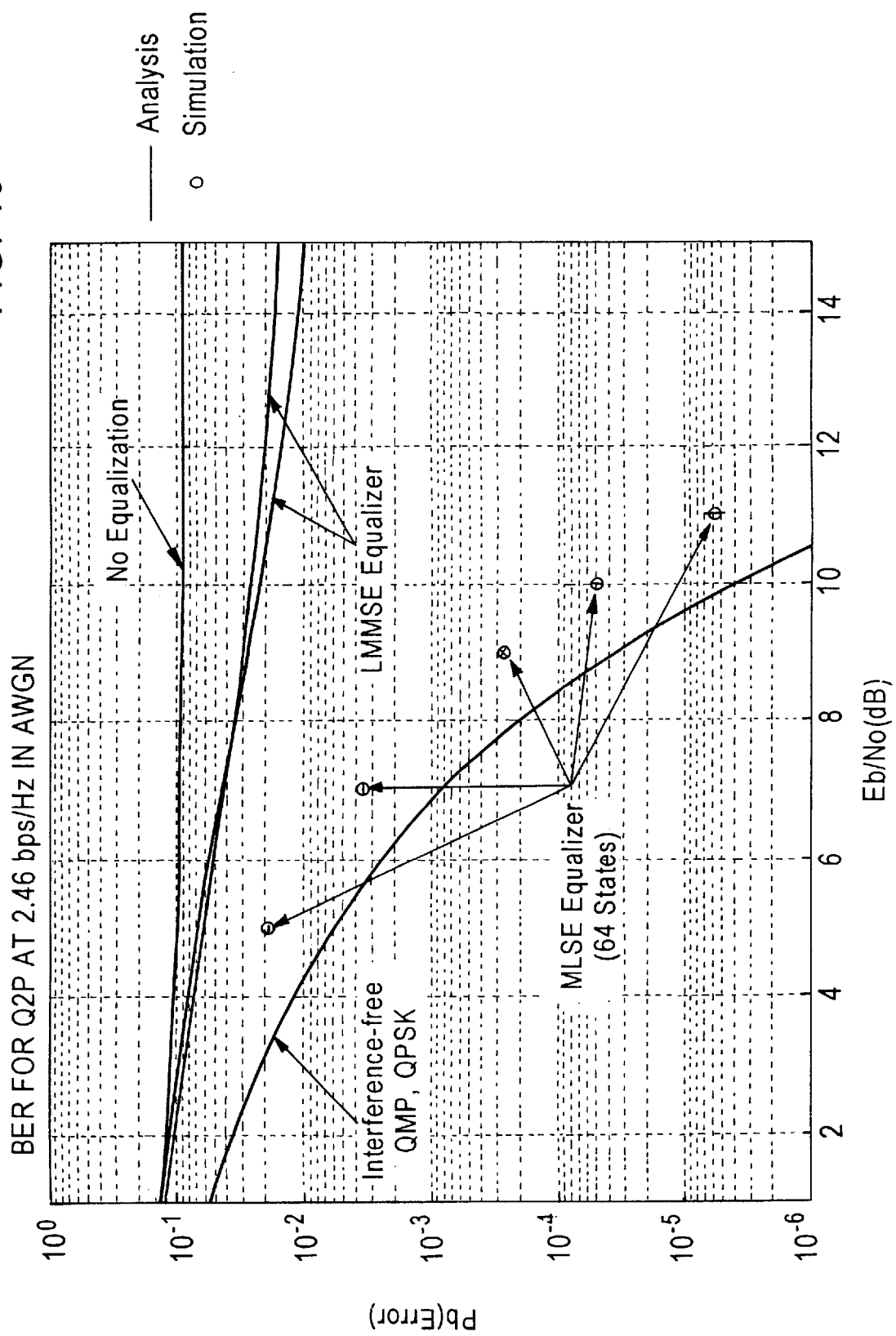

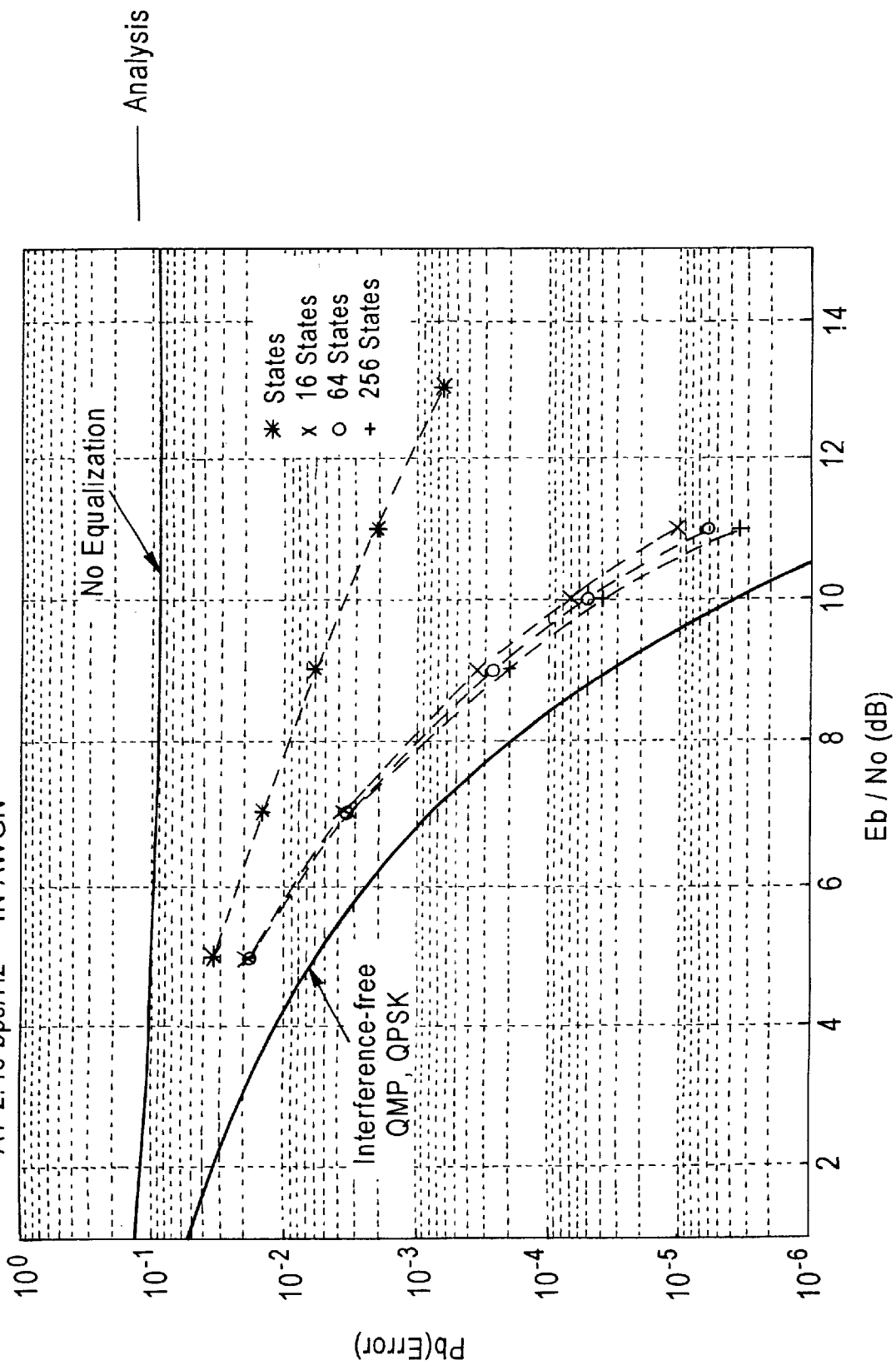

METHOD AND APPARATUS FOR QUADRATURE MULTI-PULSE MODULATION OF DATA FOR SPECTRALLY EFFICIENT COMMUNICATION

BACKGROUND OF THE INVENTION (a) Field of the Invention

The present invention relates generally to data communication and, more particularly, to a method and apparatus for communication of data using a spectrally efficient modulation format.

(b) Background of the Invention

Many different modulation formats have been used for data communication, but such modulation formats typically involve communication of one, or perhaps two, symbols (each representing one or more binary digits or bits) during each signaling interval. For example, one common modulation format used for data communication is binary phase shift key modulation (also known as BPSK modulation). BPSK modulation entails modulating the phase of a single carrier signal such that the modulated carrier signal has a first predetermined phase when a one-valued bit is transmitted and a second, different predetermined phase when a zero-valued bit is transmitted. Clearly, then, when using BPSK, exactly one pulse (representing a single bit) is communicated in each signaling interval, and no possibility exists for interference between the pulse representing a first bit communicated in one signaling interval and a different pulse representing a second, different bit communicated in a different signaling interval, whether adjacent in time or otherwise.

Another modulation format used to improve on the spectral efficiency of BPSK by transmitting more than one bit in each signaling interval is quadrature phase shift keying or QPSK modulation. QPSK modulation involves transmission of two bits of information during a single signaling interval. The increase in spectral efficiency of QPSK relative to BPSK is due to the resolvability of the QPSK communication carrier signal into two orthogonal (quadrature) components. Specifically, BPSK-type modulation is implemented on each of the "in-phase" and "quadrature" components of the QPSK carrier, each BPSK-type modulation using the full bandwidth of the QPSK signal. Because the in-phase and quadrature components of a carrier signal are orthogonal to one another, there is, once again, no possibility for interference between data pulses modulated onto each of the carrier components during a signaling interval, nor any possibility for interference between pulses modulated onto a carrier component in one signaling interval and other pulses modulated onto a carrier component in other signaling intervals.

These modulation formats and many others are well-known in the art of data communication. Another modulation format is described in detail in U.S. Pat. No. 4,680,777, issued Jul. 14, 1987, to Debabrata Saha and assigned to the University of Michigan, and further in Quadrature-Quadrature Phase-Shift Keying, an article by Debabrata Saha and Theodore G. Birdsall, appearing in IEEE Transactions on Communications, Vol. 37, No. 5, May 1989. Quadrature-Quadrature Phase-Shift Keying (also known as $Q^2$PSK modulation) is similar to QPSK modulation but entails communicating two bits of information on each quadrature component of a carrier signal during a single signaling interval. More particularly, $Q^2$PSK modulation encodes a bit of data on each of two, mutually orthogonal, pulses on each of the two quadrature components of a carrier signal. In that way, four bits of information can be communicated in a single signaling interval. Further, because the quadrature components of the carrier are orthogonal to one another, and the data shaping pulses modulated on to the quadrature components are also mutually orthogonal, $Q^2$PSK modulation would seem to offer twice the spectral efficiency of QPSK modulation with substantially the same per-bit energy requirement as QPSK.

This is not the case, however, because Q2PSK modulation employs pulses that are time-limited to a single signaling interval to avoid inter-symbol interference (ISI), and that are further mutually orthogonal to avoid cross-symbol interference (CSI). These restrictions on the number of pulses transmitted per signaling interval and on the shape of those pulses are inherent in Q2PSK modulation and operate to reduce the level of spectral efficiency that can be achieved by such modulation.

Similarly, BPSK and QPSK modulation, as well as many other well-known modulation formats, also mandate the use of only non-interfering pulses to ensure that the modulated signal can be demodulated by a receiver. As will be appreciated by those of ordinary skill in the art, this restriction to non-interfering pulses inherently and undesirably limits the level of spectral efficiency that can be attained by such modulation schemes. Further, as will also be recognized by those of ordinary skill in the art, the power required for data transmission should be minimized as much as possible for obvious reasons of cost and energy conservation. However, signals modulated by prior modulation schemes having multiple pulses per signaling interval cannot be demodulated with acceptable bit-error rates unless the signal power is elevated to an unacceptably high level.

SUMMARY OF THE INVENTION

The modulation method of the present invention employs, in one aspect, transmission of a modulation signal comprising simultaneous, interfering pulses to a receiver which is capable of demodulating the modulated signal and compensating for the interference to thereby recover the transmitted pulses and the underlying data signals therefrom. According to a different aspect of the modulation scheme of the present invention, three or more pulses may be transmitted simultaneously, and demodulated, regardless of the degree, if any, to which those pulses interfere with one another in time or frequency.

According to one aspect of the present invention, a modulator modulates at least two data signals, each comprising a set of digital values. The modulator comprises developing means for developing, for each data signal, a pulse of a predetermined shape, and combining means for combining the pulses and the data signals to form a combined signal. The combined signal includes signal components based on the pulses and on the digital values of the data signals, wherein at least two of the signal components of the combined signal overlap in time and in frequency.

In one embodiment, the developing means comprises a filter for each pulse, wherein the filter for a pulse is matched to the predetermined shape of that pulse. In that embodiment, each filter produces a filter output corresponding to one of the data signals. Further, the combining means combines filter outputs of a plurality of the filters to produce the combined signal.

According to another aspect of the invention, the modulator further comprises modulating means for modulating the combined signal onto a carrier frequency to thereby form a modulated signal.

A demodulator may be provided, comprising a receiver for receiving the modulated signal and demodulating means coupled to the receiver for demodulating the modulated signal and determining a digital value of at least one of the data signals for which signal components of the combined signal overlap in time and in frequency.

In addition, the carrier frequency may comprise first and second carrier components which are substantially orthogonal to one another, and the modulating means may modulate respective first and second portions of the combined signal onto each of the first and second carrier components.

In a particular embodiment, the developing means may develop a pulse of a predetermined shape for each of at least four data signals, and the combining means may form each of the first and second portions of the combined signal based on at least two of the pulses and on the digital values of at least two of the data signals.

The modulator of the present invention may be provided in combination with a demodulator which includes a receiver for receiving the modulated signal and demodulating means coupled to the receiver for demodulating the modulated signal and determining a digital value of at least one of the data signals based on which signal components of the combined signal overlap in time and in frequency. The demodulating means preferably determines all of the digital values, and may comprise means for removing the carrier signal from the modulated signal to thereby recover the combined signal. Further, the demodulating means may also comprise a filter matched to one of the pulses or a filter corresponding to each pulse, wherein each filter is matched to the pulse to which it corresponds.

Still further, the demodulating means may also comprise a sampler coupled to each of the filters as well as a maximum likelihood sequence estimator for determining the digital values.

Also according to the present invention, a demodulator comprises receiving means for receiving a modulated signal comprising at least two signal components overlapping in time and in frequency, wherein each component contains a stream of digital values; and demodulating means coupled to the receiving means for demodulating the modulated signal and determining digital values of at least one of the signal components. The demodulating means preferably comprises a maximum likelihood sequence estimation equalizer and preferably determines all of the digital values.

According to another aspect of the invention, a modulator is provided for modulating, during a series of signaling intervals, at least three data signals, each including a digital value for each signaling interval. The modulator includes developing means for developing, for each data signal, a pulse of a predetermined shape, and combining means for combining the pulses and the data signals to form a single combined signal including, in each signaling interval, signal components based on the pulses and on a digital value from each data signal.

According to yet another aspect of the invention, two, three, four or more digital values are concurrently communicated in each of a series of signaling intervals. In a specific example where two values are communicated, first and second pulses having predetermined, different shapes are first developed. A combined signal is then formed, the combined signal comprising, for each signaling interval, signal components based on the first and second pulses and the first and second digital values for that signaling interval. At least two of the signal components of the combined signal overlap in time and in frequency during a signaling interval. The combined signal is then transmitted to a receiver, where the combined signal is demodulated to determine the first and second digital values for each signaling interval.

In another specific example where three values are communicated, first, second, and third digital values are concurrently communicated in each of a series of signaling intervals. In accordance with this method, first, second, and third pulses having predetermined, different shapes are developed. A combined signal is then formed, the combined signal comprising, for each signaling interval, signal components based on the first, second, and third pulses and the first, second, and third digital values for that signaling interval. The combined signal is transmitted to a receiver and is demodulated at the receiver to determine the first, second, and third digital values for each signaling interval. Of course, one or more additional digital values can be communicated via the same combined signal on a carrier component that is orthogonal to the carrier component on which the first, second, and third digital values are communicated. Such additional digital values can be modulated either in accordance with the present invention or in conventional fashion.

BRIEF DESCRIPTION OF THE DRAWINGS

FIG. 13 is a flowchart showing the operation of a system in accordance with the invention; and FIGS. 14, 15 and 16 further graphs illustrating the performance of a system in accordance with the invention

DESCRIPTION OF THE PREFERRED EMBODIMENTS

Figure 1:
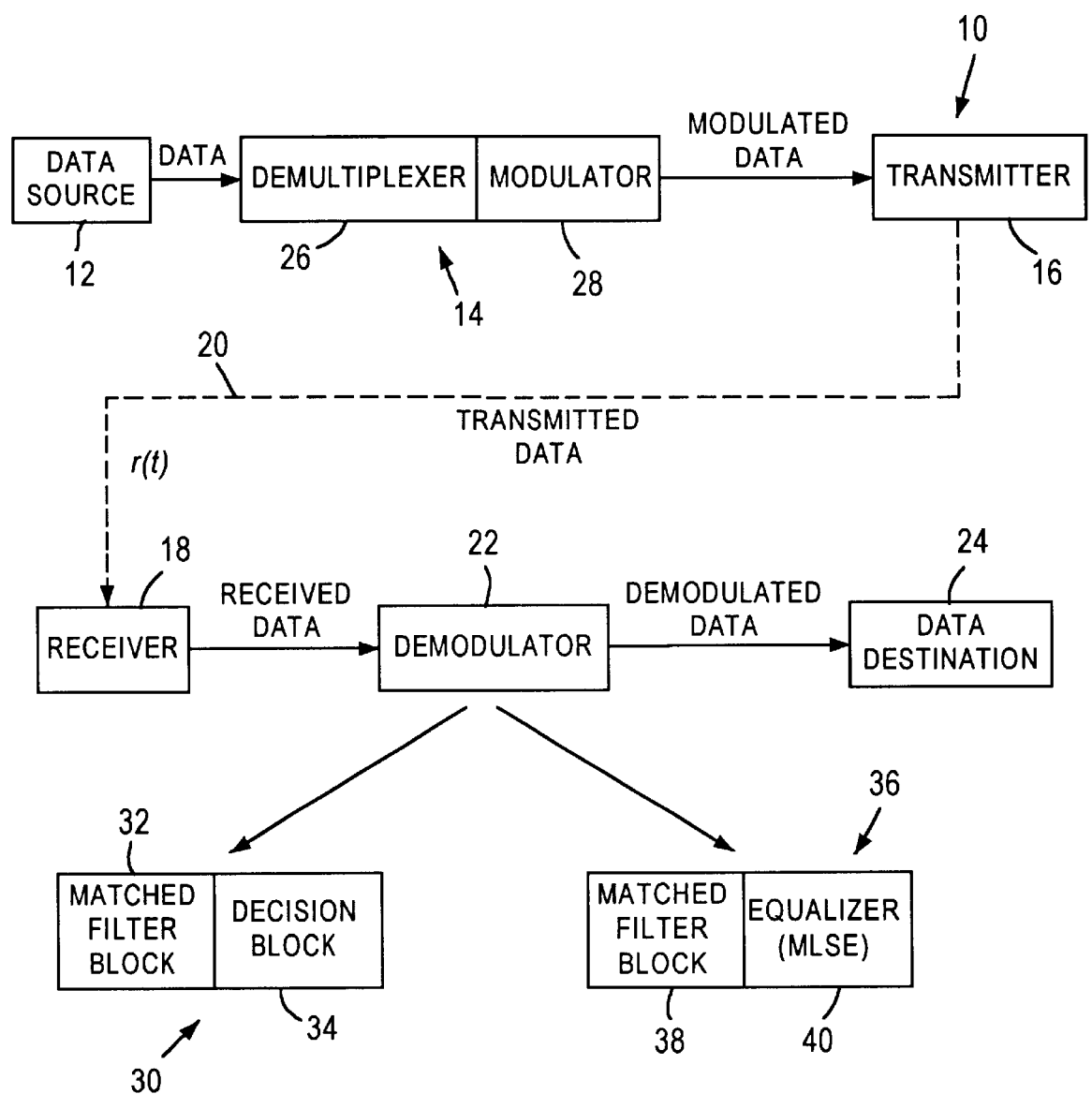
FIG. 1 is a block diagram of a communication system according to the present invention.

FIG. 1 illustrates a communication system 10 in which the modulation method and apparatus of the present invention may advantageously be used. Conventionally, data from a data source 12 is coupled to a modulator 14 which develops modulated data which, in turn, is passed to a transmitter 16 for transmission to a receiver 18 by any desired communication method. For example, the present invention can be used in conjunction with terrestrial, satellite, or cable-based communication systems, among others. The communication channel between the transmitter 16 and the receiver 18 is illustrated in FIG. 1 by a dashed line 20 which can represent any type of communication channel. The data signal r(t) received by the receiver 18 (the "received data") includes the data SQMP(t) transmitted by the transmitter 16 (the transmitted data) but may also include noise n(t), such as additive white Gaussian noise (AWGN) or interference, such as adjacent channel interference, which are known to be introduced by the communication channel 20. In other words, $$r(t) = S_{QMP}(t) + n(t). \quad (1)$$

The received data is passed to a demodulator 22 where it is demodulated in an effort to recover the original data as obtained from the data source 12. The resulting "demodulated data" is then provided to a data destination 24, such as a data processor, computer, or other device that may require the data from the data source 12.

In a preferred embodiment (see FIG. 2), the modulator 14 includes a demultiplexer 26, to split the information bitstream into parallel streams and modulation blocks 28 on each of the parallel streams. The modulation blocks 28 modulate the data output from the demultiplexer 26 to produce the modulated data. In another embodiment (not illustrated), a serial implementation could be devised to perform the same modulation processing as would be obvious to any one of ordinary skill in the art.

FIG. 1 illustrates two embodiments of the demodulator 22. A first embodiment 30 of the demodulator 22 includes a matched filter block 32 and a decision block 34. The matched filter block 32 filters the received data to develop filtered data, and the decision block 34 determines, based on the filtered data, whether each bit of the filtered data is a zero or a one. The output of the decision block 34, then, is a serial stream of data bits (the "demodulated data"). This first embodiment is principally useful when the degree or temporal and/or spectral overlap is low.

A second embodiment 36 of the demodulator 22 includes a matched filter block 38 and an equalizer 40. Once again, the matched filter block 38 filters the received data and outputs filtered data. In this embodiment, however, the equalizer 40 equalizes the filtered data and outputs a serial stream of bits of demodulated data determined mathematically from the filtered data. This second embodiment is described in greater detail hereinafter in connection with FIG. 11, and it is preferred when the degree of temporal and/or spectral overlap is high.

Figure 2:
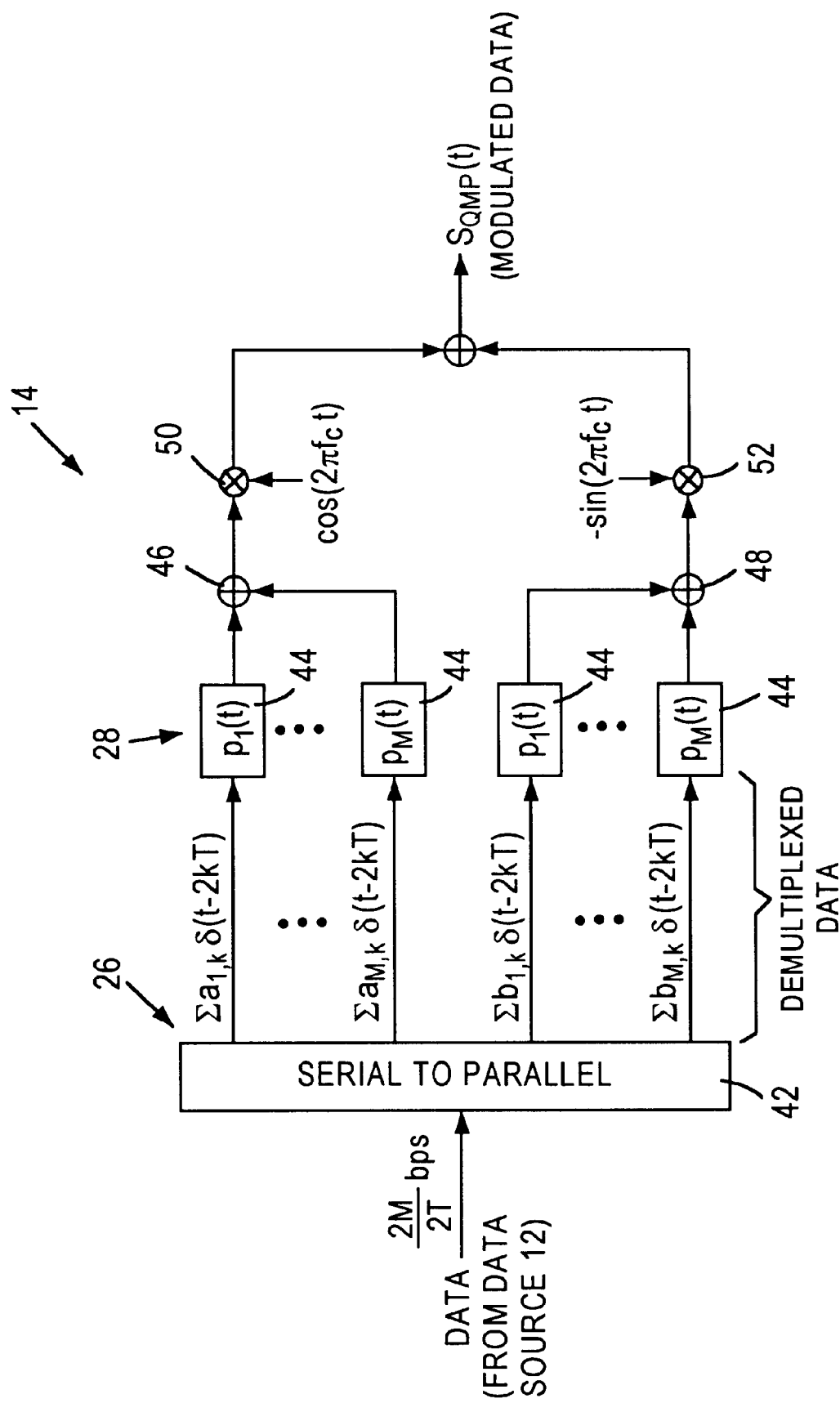
FIG. 2 is a block diagram of the modulator of FIG. 1.

The modulator 14 is illustrated in greater detail in FIG. 2. As noted above, data to be transmitted can be obtained from any suitable data source 12.

Furthermore, that data can be formatted in many different ways. For example, the data can be a single serial bit stream or a plurality of parallel bit streams. The present invention achieves enhanced spectral efficiency by transmitting multiple bits during a single signaling interval. Preferably, M bits are transmitted simultaneously on each of two orthogonal or quadrature components of a carrier signal.

Therefore, the data to be transmitted should be organized into parallel bitstreams such that one bit from each of the parallel bitstreams can be transmitted during a single signaling interval. The demultiplexer 26, as shown in FIG. 2, may comprise a serial-to-parallel converter 42 for parallelizing a serial data stream. In particular, the data received from the data source 12 of FIG. 1 is a serial stream of bits arriving at a rate of 2M/2T bits per second (bps), where M is the number of bitstreams to be transmitted on each of the two quadrature components of the carrier signal, and wherein 2T is the symbol duration or signaling interval length (i.e., the length of the time period during which 2M pulses—one from each of the 2M independent binary data streams—are transmitted over a particular carrier frequency).

The modulating pulses may assume shapes that conform to applicable bandwidth and power requirements, as is well known, but, in general, the pulses are not orthogonal to one another and lie in a time-bandwidth space geometry that typically is occupied by only one pulse or perhaps by two orthogonal pulses.

Figure 6:
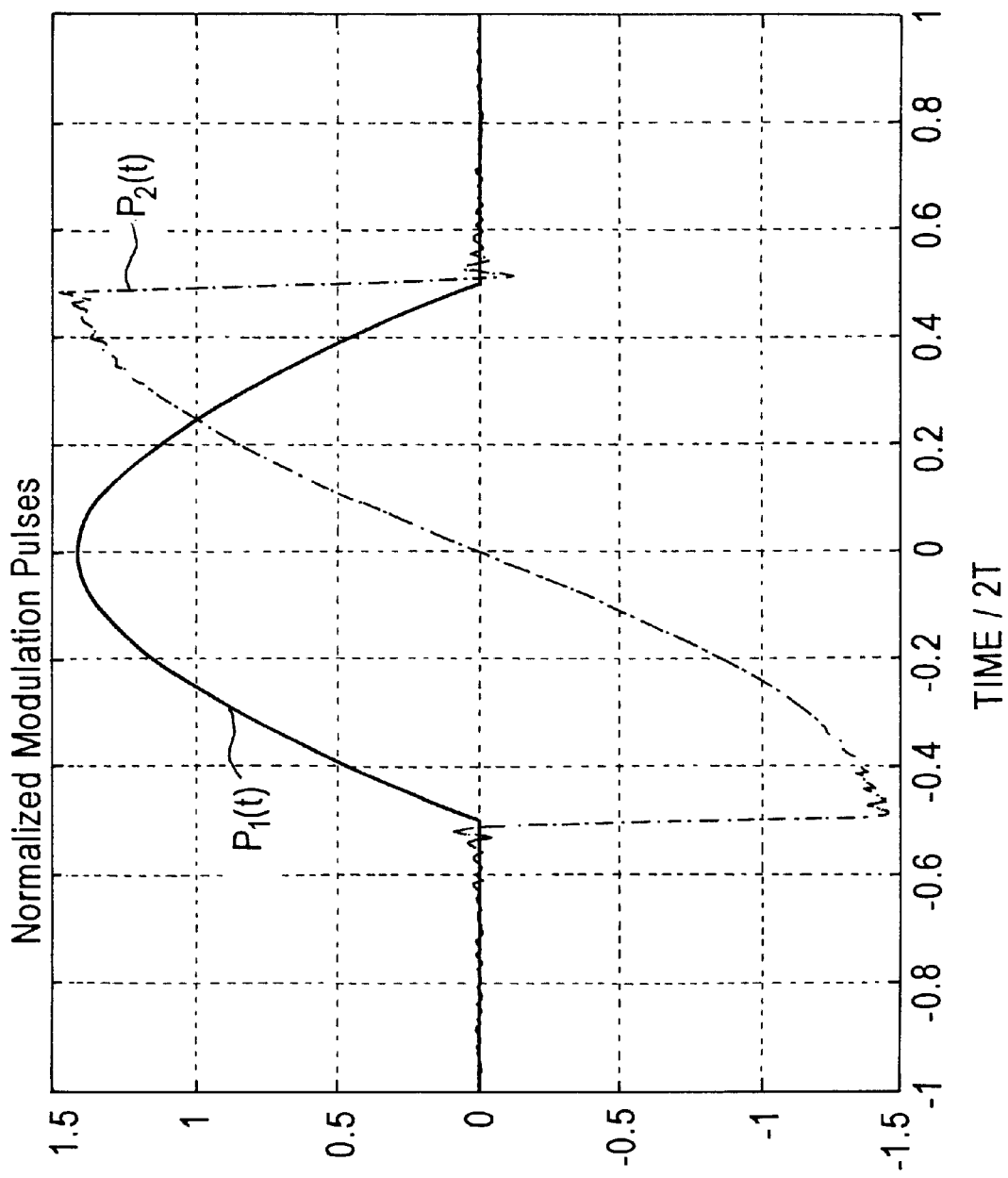
FIGS. 6, 7 and 8 are waveforms representing signals appearing in the circuit of FIG. 2.
Figure 7:
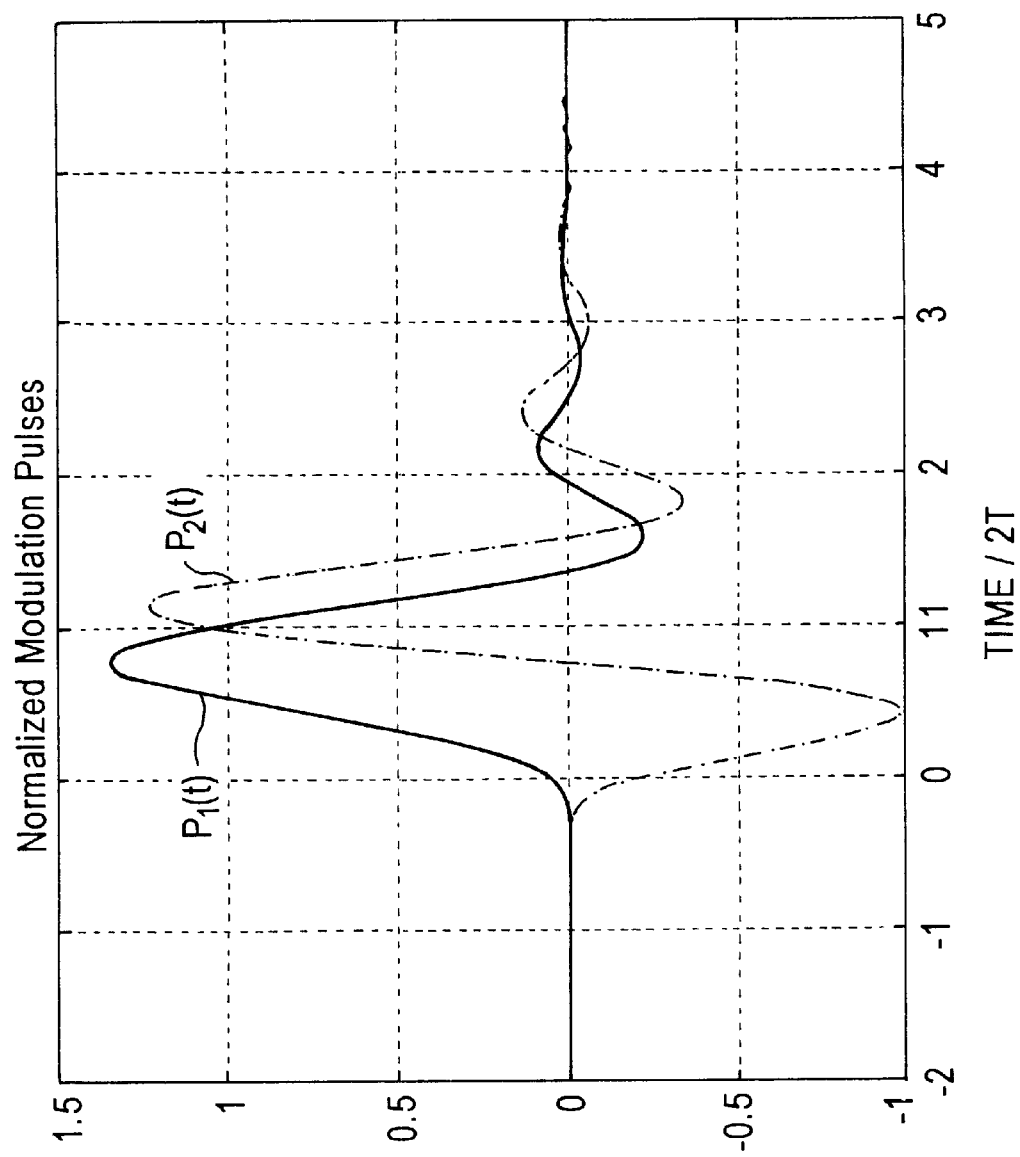
Figure 8:
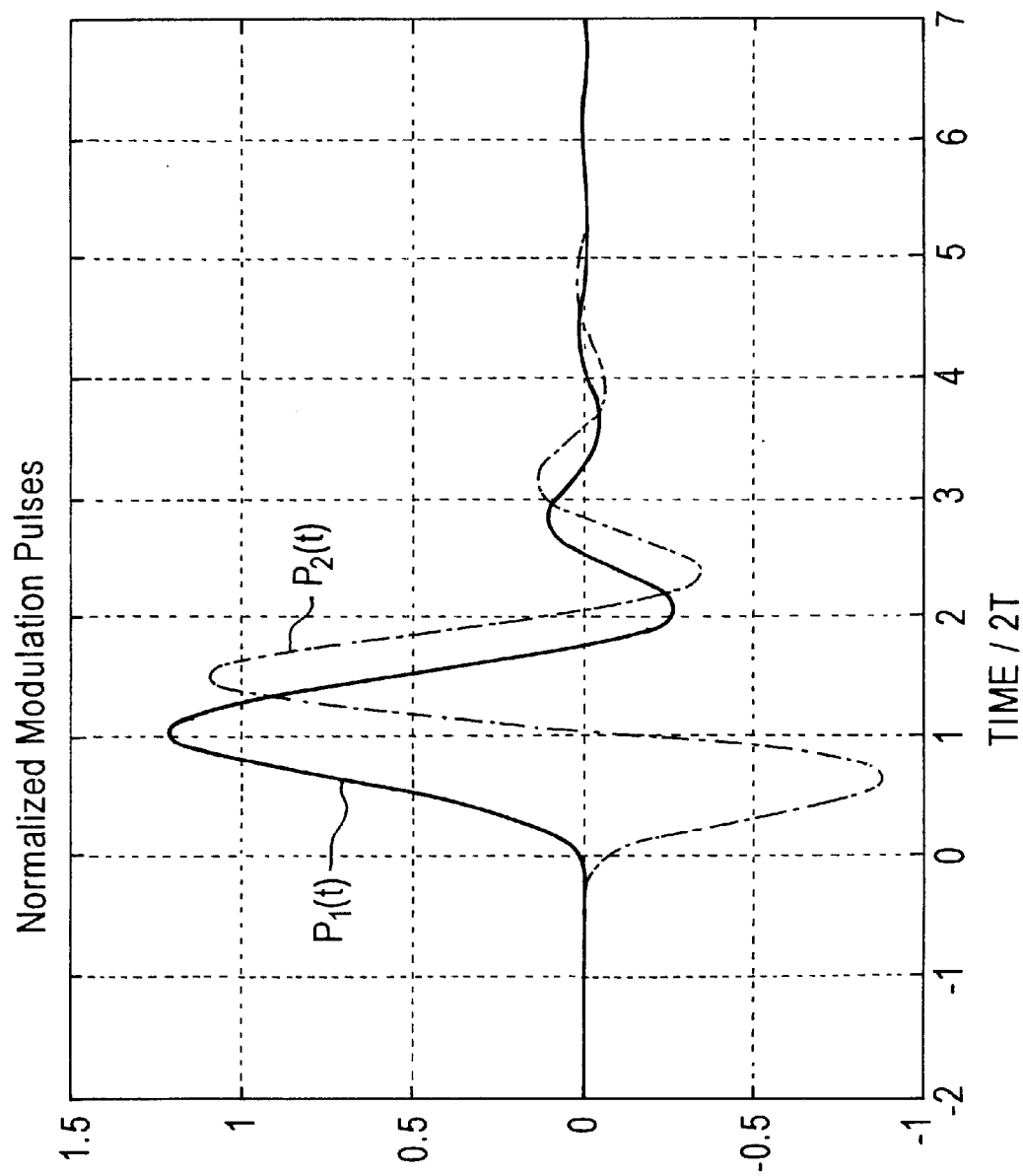

FIGS. 6, 7 and 8 represent examples of signals appearing at the inputs of the modulating filters 44 of the circuit of FIG. 2, for the special case where M=2. FIG. 6 comprises Q2PSK waveforms and show ideal time-limited pulses. The $p_2(t)$ pulse has a discontinuity which makes it occupy a large bandwidth. FIG. 7 comprises Q2P waveforms and shows bandlimited pulses at 2 bps/Hz. The spectral efficiency is based on 99% power-containment bandwidth. FIG. 8 comprises Q2P waveforms and shows bandlimited pulses at 2.46 bps/Hz. Again, the spectral efficiency is based on 99% power containment bandwidth.

The serial-to-parallel converter 42 effectively demultiplexes the information bit stream to recover the 2M independent serial binary data streams ($a_1, \ldots, a_m$ and $b_1, \ldots, b_M$). As also shown in FIG. 2, these two independent serial binary data streams are represented mathematically as:

$$\sum_{k=-\infty}^{\infty} \left[ \sum_{m=1}^{M} a_{m,k} \delta(t - 2kT) \right] \quad (2)$$

and $$\sum_{k=-\infty}^{\infty} \left[ \sum_{m=1}^{M} b_{m,k} \delta(t - 2kT) \right]. \quad (2A)$$

These 2M independent serial binary data streams comprise the demultiplexed data streams, each of which is passed through a respective modulating filter 44 having an impulse response that imparts a particular shape to each bit-representing pulse passing through the modulating filter 44. The pulses or waveform representations output by the M modulating filters 44 for each quadrature component are summed together by respective summing junctions 46, 48 to develop the in-phase and quadrature components of the aggregate carrier signal, and they are combined with the carrier signal at the multipliers 50 and 52. Mathematically, these components are characterized by the following equations:

$$s_I(t) = \sum_{k=-\infty}^{\infty} \left[ \sum_{m=1}^{M} a_{m,k} p_m(t - 2kT) \right] \quad (3)$$

and $$s_Q(t) = \sum_{k=-\infty}^{\infty} \left[ \sum_{m=1}^{M} b_{m,k} p_m(t - 2kT) \right] \quad (4)$$

where $s_I(t)$ is the in-phase component, and $S_Q(t)$ is the quadrature component of the carrier signal.

Figure 3:
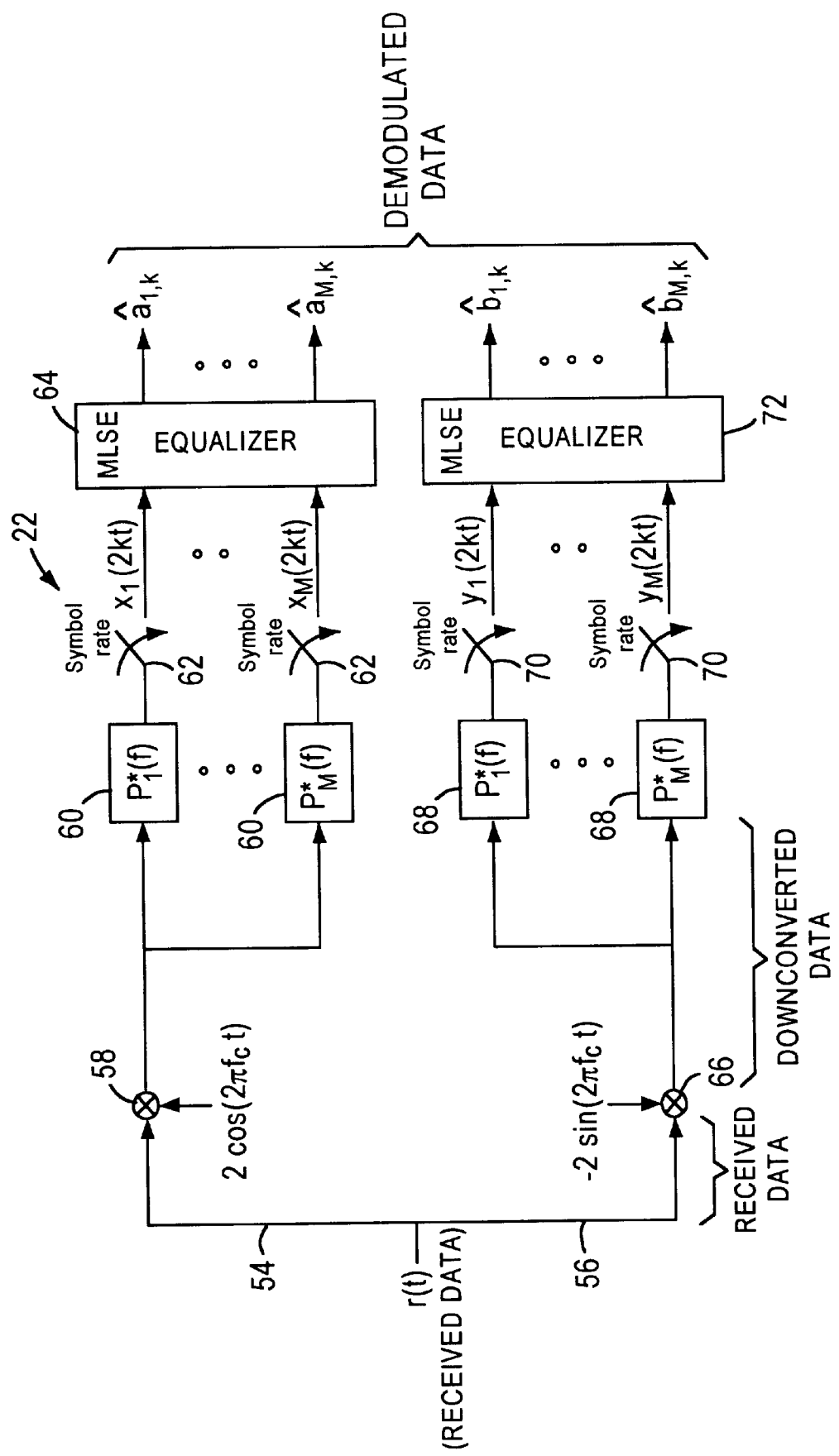
FIG. 3 is a block diagram of the demodulator of FIG. 1.

FIG. 3 illustrates the quadrature multi-pulse (QMP) demodulator 22 of FIG. 1 in greater detail. As shown therein and described above, the received signal r(t) is routed to two separate paths 54, 56. On each path, the signal r(t) is processed in order to demodulate one of the in-phase and quadrature components of the received signal.

A multiplier 58 multiplies the signal routed to the path 54 by a signal $2 \cos(2\Pi f_c t)$, which removes the in-phase carrier signal component onto which the multiplier 50 (FIG. 2) modulated the signal $S_I(t)$ This serves to downconvert the in-phase component of the modulated carrier signal to a base-band frequency. The downconverted signal is then passed to a set of M matched filters 60, where M, once again, is the number of independent serial bitstreams modulated onto the in-phase component of the carrier signal by the modulator 14. Each matched filter 60 effectively correlates the downconverted signal received from the multiplier 58 with a stored replica of a particular waveform that is to be filtered from the downconverted signal. The matched filters 60 therefore act to suppress noise and substantially maximize the signal-to-noise ratio (SNR) of the output waveform.

Figures 9, 10:
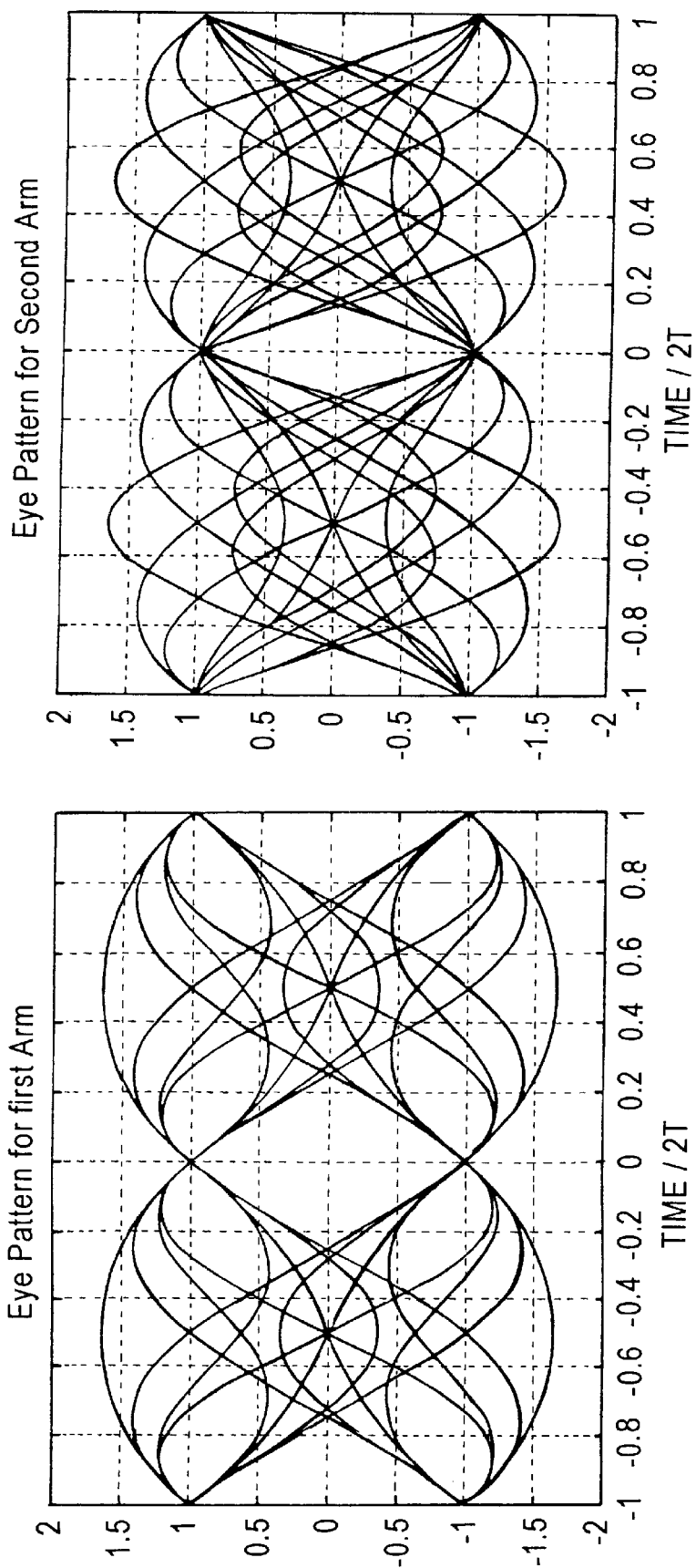
FIGS. 9 and 10 are waveforms representing signals appearing in the circuit of FIG. 3.

FIGS. 9 and 10 comprise Q2PSK eye diagrams showing ideal time limited pulses; these pulses are seen at the outputs of $P_1$ to $P_M$ blocks of the circuit of FIG. 3. These waveforms show that no interference is present at the sampling points of the matched filter outputs; the narrow eye patterns indicate sensitivity to timing misalignment.

A sampler 62 is provided to sample the output of each matched filter 60 at a predetermined symbol rate of 2M/2T bits per second. The outputs of the symbol-rate samplers 62 for the in-phase component of the transmitted data signal are therefore given by the equation:

$$x_m(2kT) = \int_{-\infty}^{\infty} r_I(t) p_m(t - 2kT) dt \quad (5)$$

where m=1, ..., M.

Those M outputs are received by an equalizer 64, which preferably comprises an MLSE equalizer as described more fully below. Each consecutively received set of M samples from the matched filter outputs 60 is processed by the equalizer 64, which develops a corresponding set of M demodulated data bits $\hat{a}_{1,k}, \hat{a}_{2,k}, \ldots, \hat{a}_{M,k}$. As described in detail below, the demodulated data bits are substantially identical to the demultiplexed data received by the modulator 28 (FIGS. 1 and 2).

Similarly, the received signal r(t) is separately multiplied by a carrier signal 31 2 sin(2Πf$_c$t), by a separate multiplier 66, to downconvert the quadrature component of the received data signal r(t) to base-band. Once again, the downconverted signal is passed to a set of matched filters 68, similar to the matched filters 60. Samplers 70 sample the outputs of the matched filters 68 for the quadrature component of the downconverted data signal and produce respective sequential streams of data samples $y_m(n)$, which are given by $$y_m(2kT) = \int_{-\infty}^{\infty} r_Q(t) p_m(t - 2kT) dt \quad (6)$$

where m=1, ..., M.

An equalizer 72 processes the M data samples for the quadrature component of the received data signal r(t) to develop a set of demodulated data bits $\hat{b}_{1,k}, \hat{b}_{2,k}, \ldots, \hat{b}_{M,k}$, which are substantially identical to the M demultiplexed data bits $b_{1,k}, b_{2,k}, \ldots, b_{M,k}$ received by the modulator 28 (FIGS. 1 and 2).

The equalizers 64 and 72 compensate for or suppress the inter-symbol and cross-symbol interference between the transmitted pulses to thereby recover the original transmitted data. More particularly, the equalizers 64 and 72 employ a multiple-input, multiple-output, statistical approach, such as maximum likelihood sequence estimation (MLSE), as described in detail below, to extract the originally transmitted data from the received, modulated signal (which, once again, comprises two or more interfering pulses on one or more quadrature components).

The statistical average likelihood of knowing a given signal in a background of additive white Gaussian noise (AWGN) is expressed by the following equation:

$$\Lambda(r(t)) = \Lambda_I(r_I(t)) \cdot \Lambda_Q(r_Q(t)). \quad (7)$$

The terms $r_I(t)$ and $r_Q(t)$ are the respective in-phase and quadrature components of the received waveform r(t). Alternatively, $$\Lambda(r(t)) = e^{-\frac{1}{N_0} \int_{-\infty}^{\infty} (r_I(t) - s_I(t))^2 dt} \cdot e^{-\frac{1}{N_0} \int_{-\infty}^{\infty} (r_Q(t) - s_Q(t))^2 dt}. \quad (8)$$

Upon substituting the values for $s_I(t)$ and $s_Q(t)$ given above, absorbing terms that are independent of the sought symbols, and performing some algebraic manipulations, the problem of maximizing the average likelihood function over the information symbols reduces to maximizing the quantity $J_I(a_1, a_2, \ldots, a_M)$ expressed by the following equation:

$$J_I(a_1, a_2, \ldots, a_M) = 2 \sum_{k=-\infty}^{\infty} \left[ \sum_{m=1}^{M} a_{m,k} x_m(2kT) \right] - \quad (9)$$

$$\sum_{k=-\infty}^{\infty} \sum_{l=-\infty}^{\infty} \left[ \sum_{m=1}^{M} \sum_{n=1}^{M} a_{m,k} R_{mn}(2(k-l)T) a_{n,l} \right]$$

Each $x_m(2kT)$ in this equation results from passing the in-phase component of a set of samples through a filter matched to pulse p(t), and then sampling the output at the symbol rate of $$\frac{1}{2T}.$$

Thus, the $x_m(2kT)$ may be expressed mathematically as:

$$x_m(2kT) = \int_{-\infty}^{\infty} r_I(t) p_m(t - 2kT) dt. \quad (10)$$

The $R_{mn}(T)$ in the foregoing expression for $J_r$ are the auto- and cross-correlation functions of the modulating pulses and are defined as:

$$R_{mn}(\tau) \triangleq \int_{-\infty}^{\infty} p_m(t) p_n(t + \tau) dt \quad (11)$$

or, $$R_{mn}(\tau) = \int_{-\infty}^{\infty} P_m^*(f) P_n(f) e^{j2\pi f \tau} df \quad (12)$$

where m and n=1, 2, ..., M. These equations describe the auto-correlation of a modulating pulse when m=n and describe the cross-correlation between two pulses when m≠n.

Similarly, the quadrature component counterpart to the above in-phase component expression is given by:

$$J_Q(b_1, b_2, \ldots, b_M) = 2 \sum_{k=-\infty}^{\infty} \left[ \sum_{m=1}^{M} b_{m,k} y_m(2kT) \right] - \quad (13)$$

$$\sum_{k=-\infty}^{\infty} \sum_{l=-\infty}^{\infty} \left[ \sum_{m=1}^{M} \sum_{n=1}^{M} b_{m,k} R_{mn}(2(k-l)T) b_{n,l} \right]$$

The $y_m(2kT)$ terms in this equation are the outputs of the samplers 70, which, in turn, sample the outputs of the filters 68 which are matched to pulses $p_n(t)$ Further, the samplers 70 sample at the symbol rate of $$\frac{1}{2T}.$$

Consequently, the outputs of the samplers 70 are given by $$y_m(2kT) = \int_{-\infty}^{\infty} r_Q(t) p_m(t - 2kT) dt. \quad (14)$$

Again, the $R_{mn}(2kT)$ terms are given by equation set forth above.

The equalizers 64, 72 determine the respective sequences of information bits $(\hat{a}_{1,k}, \hat{a}_{2,k}, \ldots, \hat{a}_{M,k})$ and $(\hat{b}_{1,k}, \hat{b}_{2,k}, \ldots, \hat{b}_{M,k})$ that maximize the above-described metrics $J_I(a_1, a_2, \ldots, a_M)$ and $J_Q(b_1, b_2, \ldots, b_M)$.

The outputs of the matched filters 60, 68, when sampled at the sample rate of $$\frac{1}{2T},$$

form a set of statistics that are sufficient for the purpose of bit retrieval (assuming that symbol timing is known or has been substantially measured by the receiver prior to equalization as is customarily the case). The matched filter output samples, $x_m(2kT)$ and $y_m(2kT)$, are described as:

$$x_m(2kT) = a_{m,k} + \sum_{\substack{j=-\infty \\ j \neq m}}^{\infty} a_{m,j} R_{mn}(2(k-j)T) + \quad (15)$$

$$\sum_{j=-\infty}^{\infty} \left[ \sum_{\substack{n=1 \\ n \neq m}}^{M} a_{n,j} R_{mn}(2(k-j)T) \right] + n_{x,m}(2kT)$$

$$y_m(2kT) = b_{m,k} + \sum_{\substack{j=-\infty \\ j \neq k}}^{\infty} b_{m,j} R_{mn}(2(k-j)T) + \quad (16)$$

$$\sum_{j=-\infty}^{\infty} \left[ \sum_{\substack{n=1 \\ n \neq m}}^{M} b_{n,j} R_{mn}(2(k-j)T) \right] + n_{y,m}(2kT)$$

for $m = 1, 2, \ldots, M$.

The first term on the right-hand side of these two equations is, in each case, the desired information bit. The second term in each equation is the contribution to the matched filter output sample due to inter-symbol interference (ISI), which is determined by the symbol-spaced samples of the auto-correlation functions. The third term in each equation represents the contribution due to cross-symbol interference (CSI), which is determined by the symbol-spaced samples of the cross-correlation functions, and the last term in each equation represents the Gaussian noise corrupting the matched filter output sample. The noise terms $n_{x,m}(2kT)$ and $n_{y,m}(2kT)$ are colored for a specific m and correlated across different m's but independent across the in-phase and quadrature components of the carrier signal. Significantly, the forgoing implementation of the present invention employs the correlated matched filter outputs directly, without requiring the additional complexity of employing a whitening pre-processor.

When exactly two pulses are modulated onto each quadrature component of the carrier (i.e., when M=2), and the pulses on each quadrature component are non-interfering (i.e., are at least orthogonal to one another), the quadrature multi-pulse or QMP modulation scheme of the present invention reduces to Q2PSK modulation. In this simple case, which forms no part of the present invention, the four transmitted non-interfering pulses may be easily demodulated to recover the transmitted binary data by making decisions about the four pulses independently of one another and on a symbol-by-symbol basis. For example, four threshold devices may be used in parallel.

In contrast, the QMP modulation scheme of the present invention employs interfering pulses. Consequently, the simplistic demodulation approach used for Q2PSK modulation will not work for QMP modulation. Depending upon the extent of interference between pulses modulated on the same quadrature component of the carrier, the simple, prior-art demodulation approach will demodulate the transmitted pulses with a significantly higher bit-error probability $P_b(E)$ than the QMP demodulation approach of the present invention, as illustrated in FIG. 4.

This figure shows a curve corresponding to an ISI-free two-pulse modulation scheme (one wherein no inter-symbol interference is present between the two pulses modulated on the same quadrature component of the carrier signal). In other words, $R_{1,2}(0)=0$ for the two pulses. To interpret this curve, a desired bit-error probability, $P_b(E)$, such as 10-2, is chosen, and the energy-per-bit to noise ratio $(E_b/N_o)$ required to realize the chosen bit-error probability is obtained by reading from the graph of FIG. 4 the value corresponding to the point where the ISI-free curve has the chosen y-coordinate or $P_b(E)$ value. Clearly, reduction of the bit error probability requires an increase in the average energy per bit, even in the ISI-free case.

Figure 4:
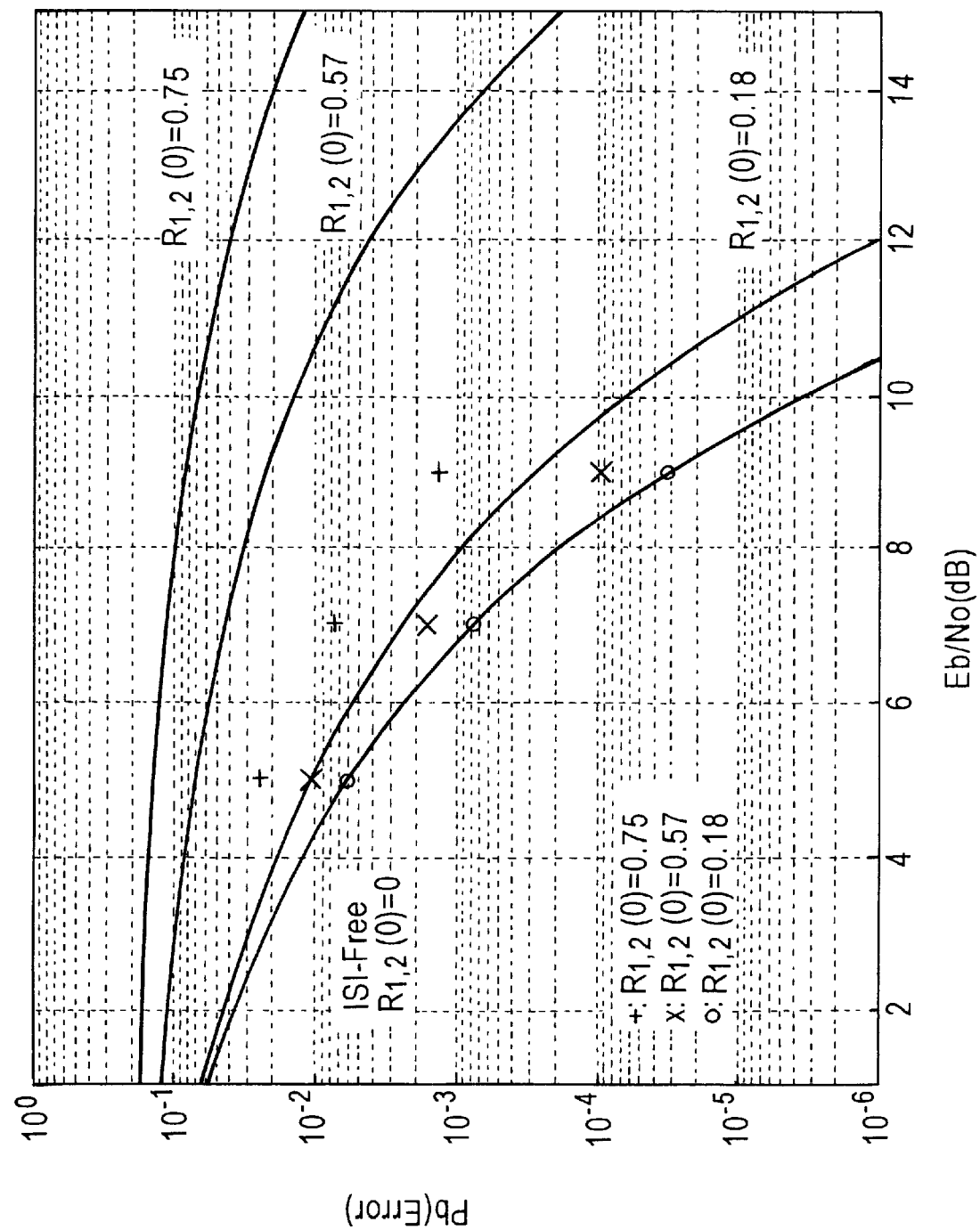
FIG. 4 is a graph contrasting the performance of demodulation according to the method of the present invention with demodulation by a prior-art method.

All four solid-line curves in FIG. 4 represent performance of the simple prior-art demodulation scheme employing independent symbol-by-symbol decoding. As shown in FIG. 4, as the cross-correlation $R_{1,2}(0)$ between the interfering pulses on a quadrature component increases, the performance of such a demodulation scheme becomes progressively worse than for the ISI-free case and eventually yields essentially worthless results. For example, to achieve a bit-error probability of $P_b(E)=10-2$, an energy per-bit to noise ratio of approximately 5 dB is required for a cross-correlation value $R_{1,2}(0)=0.18$, whereas for a cross-correlation value $R_{1,2}(0)=0.57$, an energy per-bit to noise ratio of approximately 11 dB is required to realize the same bit-error probability. As is well known to those of ordinary skill in the art, this approximately 6 dB increase in the $E_b/N_o$ ratio required to realize a desired upper bound for the bit-error probability corresponds approximately to a four-fold increase in the energy required for the data transmission.

FIG. 4 also shows data points obtained from performance simulations of the QMP demodulation scheme of the present invention. As stated above, the ISI-free, two-pulse case, where $R_{1,2}(0)=0$, is simply Q2PSK and forms no part of the present invention. However, for interfering modulated pulses having a cross-correlation value $R_{1,2}(0)=0.18$ (denoted by "○" symbols in FIG. 4), the QMP demodulation scheme of the present invention is shown to perform just as well as the simple, prior-art demodulation scheme, which practically requires pulses that do not interfere at all. Similarly, the performance of the QMP demodulation scheme of the present invention for the case of interfering pulses having a cross-correlation value of $R_{1,2}(0)=0.57$ (denoted by "×" symbols in FIG. 4) is actually better than the performance of the prior-art demodulation scheme for a much lower cross-correlation value ($R_{1,2}(0)=0.18$). Still further, the performance of the QMP demodulation scheme of the present invention for highly interfering pulses having a cross-correlation of $R_{1,2}(0)=0.75$ (denoted by "+" symbols in FIG. 4) is only slightly degraded from the aforementioned cases of much lower cross-correlation values, but is nonetheless significantly better than the performance of the simple prior-art demodulation scheme even for cross-correlation values of $R_{1,2}(0)=0.57$.

Figure 5:
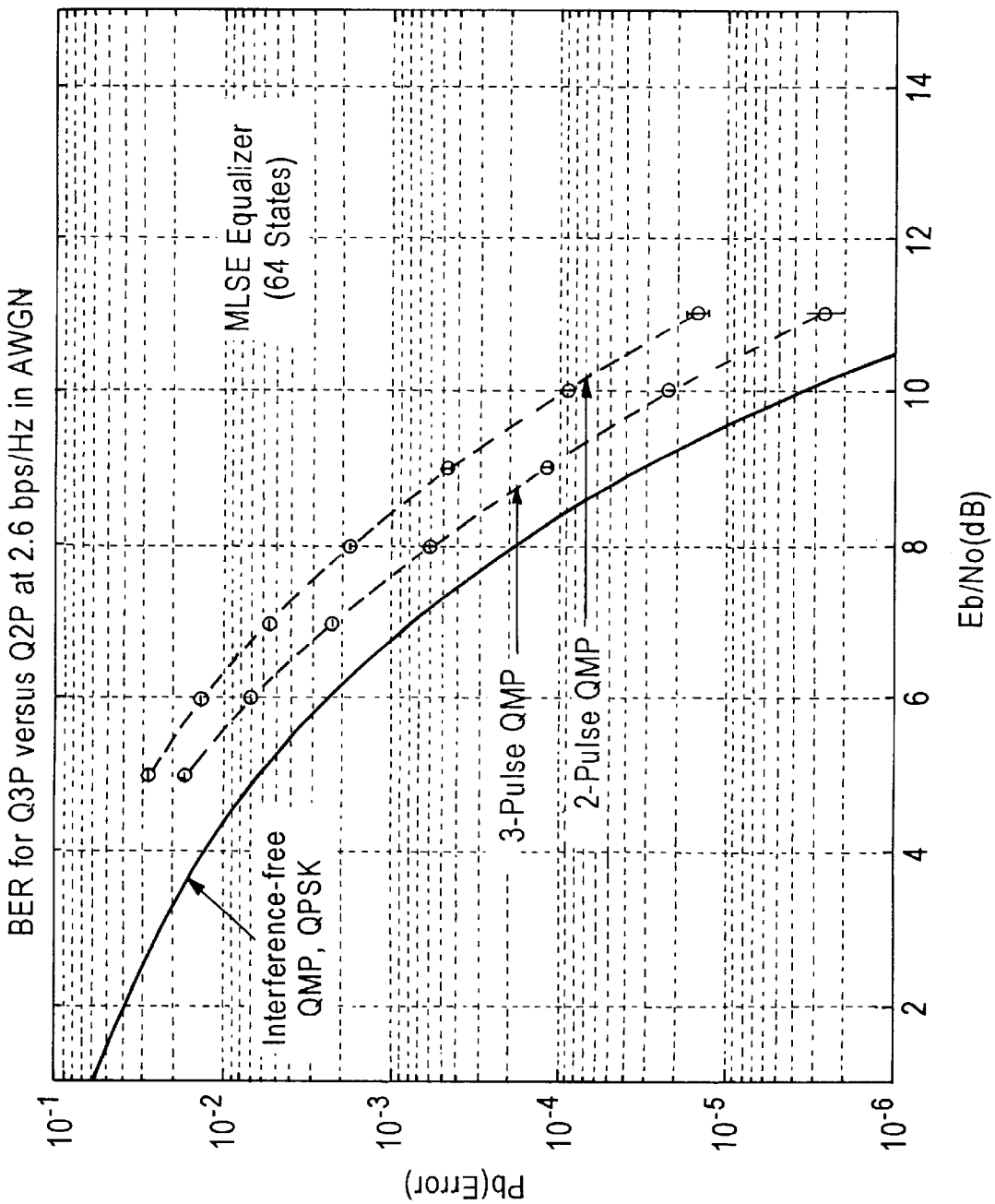
FIG. 5 is a graph illustrating the performance of the demodulation method of the present invention using two and three simultaneous; interfering pulses per signaling interval.

FIG. 5 is a graph showing a comparison of the performance of two- and three-pulse QMP demodulators 22 (FIGS. 1 and 3) according to the present invention with demodulation of two non-interfering (ISI-free) pulses. Specifically, the data shown are for a three-pulse modulation scheme (also referred to as Q3P). The three modulating filters 44 used for each quadrature component have the following pulse functions:

$$P_1(f) = \left[\sqrt{2T}\left(\frac{\sin(2\pi fT)}{2\pi fT}\right)\right]B_{6,f_{3dB}}(f) \quad (17)$$

$$P_2(f) = \left[-2j\frac{\sqrt{T}}{\pi}\left(\frac{\sin(2\pi fT)}{1-4f^2T^2}\right)\right]B_{6,f_{3dB}}(f) \quad (18)$$

$$P_3(f) = \left[4\frac{\sqrt{T}}{\pi}\left(\frac{fT\sin(2\pi fT)}{1-4f^2T^2}\right)\right]B_{6,f_{3dB}}(f) \quad (19)$$

where $B_{6,f_{3dB}}$) mathematically represents a 6th order Butterworth filter having a 3-dB cut-off frequency of $$f_{3dB} = \frac{.45}{T} \text{ Hz.}$$

Notably, $P_1(f)$ and $P_3(f)$ are not orthogonal to one another, but rather interfere with one another and have a cross-correlation of 44% (i.e., $R_{1,3}(0)=0.44$). The foregoing set of pulse functions is obtained by band-limiting the first three basis functions of the Fourier series and achieves a spectral efficiency level of 3.33 bps/Hz based on a 90% power containment definition of bandwidth. For M>3, additional Fourier basis functions that have been suitably bandlimited could also be used. Significantly, this level of spectral efficiency is 100% higher than that of the Q2PSK modulation scheme described in Saha, Quadrature-Quadrature Phase-Shift Keying, IEEE Transactions on Communications, Vol. 37, No. May 5, 1989 (p. 442, Table I). Based on a 99% power containment definition of bandwidth, the spectral efficiency level associated with this figure is 2.6 bps/Hz, which is about 62% higher than a practical QPSK system operating at 1.6 bps/Hz. Further, the performance of a three-pulse QMP demodulator is even better than that of a 2-pulse QMP demodulator and is not significantly worse than the performance for demodulation of interference-free pulses as shown in FIG. 5.

Each of these components is modulated onto a respective component (in-phase or quadrature) of a carrier signal having a frequency of f, Hz. Specifically, the carrier signal includes a first component expressed by $\cos(2\Pi f_c t)$ and a second component characterized by $-\sin(2\Pi f_c t)$. Multipliers 50, 52 (FIG. 2) multiply the pulses described by the foregoing equations by the first and second carrier components to form the overall QMP-modulated data signal $s_{QMP}(t)$ which is coupled to the transmitter 16 for transmission to the receiver 18 (FIG. 1). Therefore, the QMP-modulated data signal $s_{QMP}(t)$ is given by the following equation:

$$s_{QMP}(t) = s_I(t)\cos(2\Pi f_c t) - s_Q(t)\sin(2\Pi f_c t) \quad (20)$$

where $s_I(t)$ and $s_Q(t)$ are the above-described in-phase and quadrature components of the multi-pulse data signal modulated onto the carrier signal, and $f_c$ is the frequency of the carrier signal.

As mentioned above, the method of communication employed by the transmitter 16 forms no part of the present invention, and any desired communication method (i.e., satellite broadcasting, terrestrial broadcasting, and cable-based communication) can be employed in conjunction with the data modulation scheme of the present invention.

Further, the spectral efficiency made possible by the use of the QMP modulation format of the present invention comes at the cost of relatively severe inter-symbol interference (ISI) between symbols or pulses of a given signal bitstream, as well as cross-symbol interference (CSI) between symbols or pulses of different transmission bitstreams. ISI results from constraining the transmission bandwidth of a predetermined set of transmission bitstreams, and CSI results from increasing the data transmission rate for a given transmission bandwidth. Consequently, a QMP demodulator 22 must be capable of retrieving the modulated information bits from the received data signal while suppressing the various types of interference.

Some prior-art communication systems have employed non-interfering data pulses in order to simplify demodulation of the transmitted data. As noted above, however, such systems do not make as efficient use of available bandwidth resources. The present invention employs data pulses that are not required to be interference free in time or frequency because the demodulation performed by the demodulator 22 of the present invention is capable of suppressing intersymbol and cross-symbol interference as described in more detail below.

Figure 11:
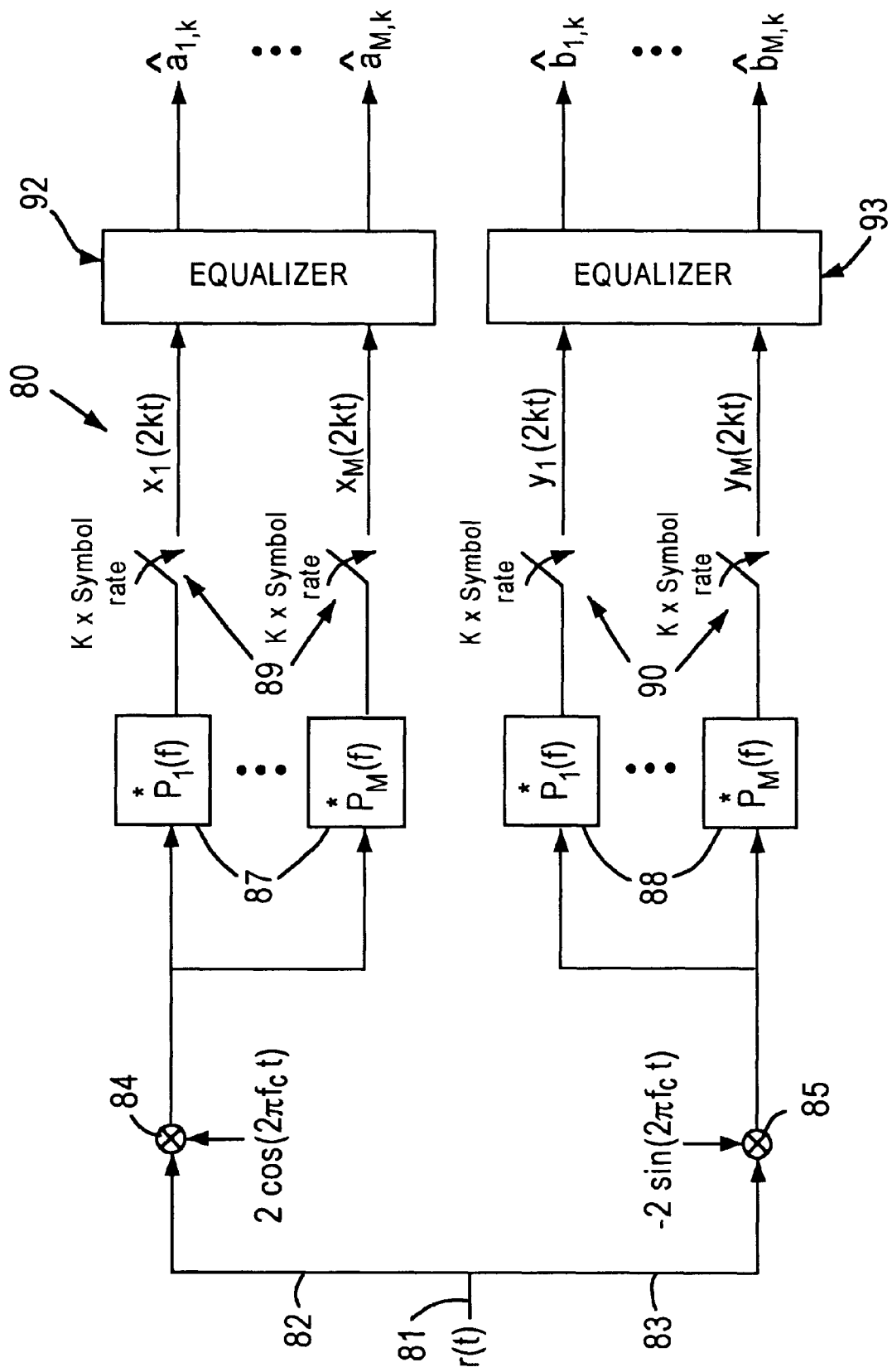
FIG. 11 is a block diagram of a demodulator including equalizers constructed in accordance with the present invention.

One exemplary measure of the performance of a communication system, such as the communication system 10 of the present invention, is the probability $P_b(E)$ that a transmitted bit will be received erroneously (i.e., that a one-valued transmitted bit will be received as a zero-bit, or vice-versa), which is given by:

$$P_b(E) \triangleq \frac{1}{\sqrt{2\pi}}\int_{\sqrt{\frac{2E_b}{N_0}}}^{\infty} e^{-\frac{y^2}{2}}dy, \quad (21)$$

for the interference-free case. Because QMP modulation employs 2M independent simultaneously transmitted serial bitstreams, the bit-error probability $P_b(E)$ is defined for QMP modulation as the average of the bit-error probabilities $P_{b,i}(E)$ associated with the 2M transmission bit streams, where i=1, 2, . . . , 2M. In other words, the bit-error probability for quadrature multi-pulse modulation is $$P_b(E) = \frac{P_{b,1}(E) + P_{b,2}(E) + \ldots + P_{b,2M}(E)}{2M} \quad (22)$$

where $P_b(E)$ is the average bit energy of the transmitted data bits. This performance measure quantifies the ability of the QMP demodulator 22 of the present invention to suppress interference in the received data. Of course, alternative measures of performance (such as symbol-error probability and word-error probability) could also be used. FIG. 11 illustrates a receiver 80 in accordance with a preferred embodiment of the invention. The receiver 80 receives an incoming signal r(t) at an input 81 and, in the specific example of the invention shown in FIG. 11, routes the signal through two paths or branches 82 and 83. Similar to the circuit shown in FIG. 3, the carrier signal is removed at multipliers 84 and 85. The converted signals are then passed through two groups of M matched filters 87 and 88 which correlate the signals with stored replicas. After passing through two groups of M of samplers 89 and 90, the signals are received by two equalizers 92 and 93. The two equalizers are identical, with the exception of different inputs and different outputs, and the construction and operation of only one will be described herein. Each of the equalizers produces M demodulated databits from M sets of samples $x_1(n), \ldots, x_M(n)$, received from the samplers 89 and 90.

Each of the two equalizers 92 and 93 forms a novel quadrature multi-pulse (QMP)—compatible maximum likelihood sequence estimation (MLSE) equalizer which extracts transmitted information bits from the signals. The equalizers 92 and 93 are efficient recursive implementations which compensate for both inter-symbol and intra-symbol interference, and can accommodate multiple simultaneous interfering pulses in the same signaling interval. To reduce complexity, the system includes parallel equalizers on each quadrature arm.

The following is an overview of the operation of the receiver shown in FIG. 11. The incoming signal r(t) appearing of the line 81 comprises a carrier and modulating pulses. The signal r(t) forms a sequence of signaling intervals, and the pulses are weighted by a distinct binary +1/−1 valued information bit in each interval. In the specific example illustrated, the modulating pulses include two or more in-phase pulses on the branch 82 and two or more quadrature pulses on the branch 83. The in-phase pulses differ one from another (i.e., each has a distinct shape) and they exist simultaneously in time and frequency; the quadrature pulses also differ one from another and exist simultaneously in time and frequency.

The signal r(t) is mixed with another at the multipliers 84 and 85 to remove the carrier, and the modulating pulses are fed to the filters 87 and 88. The number of filters 87 is equal to the number of in-phase pulses on the branch 82, and the number of filters 88 is equal to the number of quadrature pulses on the branch 83. Each of the filters is matched to the shape of one of the pulses, and only one pulse shape appears at the output of the associated filter.

The samplers 89 sample the outputs, sequentially, of the filters 87 and pass a series of samples of the pulses to the equalizer 92, in each signaling interval. The samplers 90 perform a similar function for the filters 88 and the equalizer 93. In this example, the number of samplers equals the number of filters. The equalizers 92 and 93 decode the pulses received from the samplers and determine the binary information bits represented by the pulses.

With regard to a more detailed description of the structure and operation of the receiver 80 shown in FIG. 11, the received waveform r(t) consists of the desired signal and noise, as defined in equation (1).

As previously mentioned, the receiver shown in FIG. 11 includes two equalizers 92 and 93 placed in parallel, one for the in-phase and the other for the quadrature portion of the system. This arrangement simplifies the computational load that is needed by the equalizers and exploits the fact that, in a well-designed receiver, the I/Q cross-talk is negligible.

As mentioned above, the QMP modulation attempts to increase the bit rate of data transmission combined with a desire to constrain bandwidth, and as a result severe intersymbol interference (ISI), as well as interference from adjacent transmissions (or cross-symbol interference (CSI)), will result. The present invention is therefore directed towards the optimal, albeit complex, sequence estimation method. This is in contrast with the simple symbol-by-symbol techniques that are ineffective when operating at high levels of spectral efficiency.

Start by assuming that, for practical purposes, the ISI and CSI extend over a finite time interval spanning $K_{eq}$ symbols. This is equivalent to assuming that the auto- and cross-correlation functions $R_{ij}(2kT)$ of the used pulses are zero for $k > K_{eq}$. The actual value of $K_{eq}$ is therefore directly related to the shape of the modulating pulses $p_m(t)$, $m=1, \ldots, M$. From basic principles of Fourier transforms, a signal cannot be both time-limited and bandlimited and that squeezing a function in frequency causes it to spread in time (and vice versa by virtue of the duality theorem). This implies that for higher levels of bandwidth efficiency the $K_{eq}$ considered has to be increased so that the system can adequately compensate for CSI and ISI. Increasing $K_{eq}$ also increases the computational load (in terms of the number of states per symbol), reinforcing a classic trade-off between performance quality and complexity. (However, fairly good performance can be achieved here with small numbers of $K_{eq}$ even at 2.46 bits-per-second/Hz based on 99% power-containment of bandwidth. In fact, as will be discussed below, performance improvement saturates for $K_{eq} > 3$).

From statistical theory of hypothesis testing, it is well known that the optimum solution is the one that minimizes sequence error probability and is derived from implementing the average likelihood-ratio function (ALF).

The following discussion provides specific examples of QMP when the number of pulses is two and when it is three, and provides the expressions for the efficient implementation of the MLSE equalizer when the number of pulses is made general.

First, with regard to a QMP with two pulses, by absorbing terms that are independent of the sought symbols and after some algebraic manipulations, maximizing the ALF over the in-phase information symbols is equivalent to maximizing the quantity $J_I(a_1, a_2)$ yields $$J_I(a_1, a_2) = 2 \sum_{k=-\infty}^{\infty} a_{1,k} x_1(2kT) + \qquad (23)$$
$$2 \sum_{k=-\infty}^{\infty} a_{2,k} x_2(2kT) -$$
$$\sum_{k=-\infty}^{\infty} \sum_{l=-\infty}^{\infty} a_{1,k} R_{11}(2(k-l)T) a_{1,l} -$$
$$\sum_{k=-\infty}^{\infty} \sum_{l=-\infty}^{\infty} a_{1,k} R_{12}(2(k-l)T) a_{2,l} -$$
$$\sum_{k=-\infty}^{\infty} \sum_{l=-\infty}^{\infty} a_{2,k} R_{21}(2(k-l)T) a_{1,l} -$$
$$\sum_{k=-\infty}^{\infty} \sum_{l=-\infty}^{\infty} a R(2(k-l)T) a$$

The $x_1(2kT)$ and $x_2(2kT)$ in equation (27) result from passing the in-phase portion of the observation through a filter matched to pulse $p_1(t)$ and $p_2(t)$, respectively, and then sampling the output at the symbol rate of $(2T)^{-1}$, or $$x_1(2kT) \triangleq \int_{-\infty}^{\infty} r_I(t) p_1(t - 2kT) dt \quad (24)$$

$$x_2(2kT) \triangleq \int_{-\infty}^{\infty} r_I(t) p_2(t - 2kT) dt \quad (25)$$

Similarly, it is possible to obtain the quantity $J_Q(a_3, a_4)$ that is the quadrature counterpart to the above, as $$J_I(a_3, a_4) = 2 \sum_{k=-\infty}^{\infty} a_{3,k} y_1(2kT) + \quad (26)$$
$$2 \sum_{k=-\infty}^{\infty} a_{4,k} y_2(2kT) -$$
$$\sum_{k=-\infty}^{\infty} \sum_{l=-\infty}^{\infty} a_{3,k} R_{11}(2(k-l)T) a_{3,l} -$$
$$\sum_{k=-\infty}^{\infty} \sum_{l=-\infty}^{\infty} a_{3,k} R_{12}(2(k-l)T) a_{4,l} -$$
$$\sum_{k=-\infty}^{\infty} \sum_{l=-\infty}^{\infty} a_{4,k} R_{21}(2(k-l)T) a_{3,l} -$$
$$\sum_{k=-\infty}^{\infty} \sum_{l=-\infty}^{\infty} a_{4,k} R_{22}(2(k-l)T) a_{4,l}$$

where:

$$y_1(2kT) \triangleq \int_{-\infty}^{\infty} r_Q(t) p_1(t - 2kT) dt \quad (27)$$

$$y_2(2kT) \triangleq \int_{-\infty}^{\infty} r_Q(t) p_2(t - 2kT) dt \quad (28)$$

as shown in equation (6).

By assuming that N symbols are transmitted, the straightforward way of implementing the optimal rule is to:

1. evaluate the metric $J_I(a_1, a_2)$ of equation (27) for all possible 4N sequences $(a_1, a_2)$;

2. evaluate the metric $J_Q(b_1, b_2)$ of equation (30) for all possible 4N sequences $(b_1, b_2)$ 3. select the sequence $(a_1, a_2, b_1, b_2)$ that yields the largest metrics.

The above procedure can be implemented in the most efficient way by generalizing the modified Viterbi Algorithm (known in the prior art) to accommodate the specific structure of the QMP. To this end, the metrics of equations (27) and (30) can be made recursive by the relations:

$$J_{I,n}(a_{1,n}, a_{2,n}) = J_{I,n-1}(a_{1,n-1}, a_{2,n-1}) + \quad (29)$$
$$a_{1,n} \bigg[ 2x_1(2nT) - R_{11}(0) a_{1,n} -$$
$$2 \sum_{m=1}^{k_{eq}} R_{11}(2mT) a_{1,n-m} -$$
$$R_{12}(0) a_{2,n} - 2 \sum_{m=1}^{K_{eq}} R_{12}(2mT) a_{2,n-m} \bigg] +$$
$$a_{2,n} \bigg[ 2x_2(2nT) - R_{22}(0) a_{2,n} -$$
$$2 \sum_{m=1}^{K_{eq}} R_{22}(2mT) a_{2,n-m} - R_{21}(0) a_{1,n} -$$
$$2 \sum_{m=1}^{K_{eq}} R_{21}(2mT) a_{1,n-m} \bigg] \text{ and}$$

$$J_{Q,n}(b_{1,n}, b_{2,n}) = J_{Q,n-1}(b_{1,n-1}, b_{2,n-1}) + \quad (30)$$
$$b_{1,n} \bigg[ 2y_1(2nT) - R_{11}(0) b_{1,n} -$$
$$2 \sum_{m=1}^{k_{eq}} R_{11}(2mT) b_{1,n-m} - R_{12}(0) b_{2,n} -$$
$$2 \sum_{m=1}^{K_{eq}} R_{12}(2mT) b_{2,n-m} \bigg] +$$
$$b_{2,n} \bigg[ 2y_2(2nT) - R_{22}(0) b_{2,n} -$$
$$2 \sum_{m=1}^{K_{eq}} R_{22}(2mT) b_{2,n-m} - R_{21}(0) b_{1,n} -$$
$$2 \sum_{m=1}^{K_{eq}} R_{21}(2mT) b_{1,n-m} \bigg]$$

Equivalently, the channel with limited ISI can be viewed as a finite-state discrete-time machine where the in-phase state $S_{I,1}$ at the discrete-time 1 is defined as $$S_{I,l} \triangleq (a_{1,l-1}, \ldots, a_{1,l-K_{eq}}; a_{2,l-1}, \ldots, a_{2,l-K_{eq}}) \quad (31)$$

while the quadrature state is:

$$S_{Q,l} \triangleq (b_{1,l-1}, \ldots, b_{1,l-K_{eq}}; b_{2,l-1}, \ldots, b_{2,l-K_{eq}}) \quad (32)$$

Figure 12B:
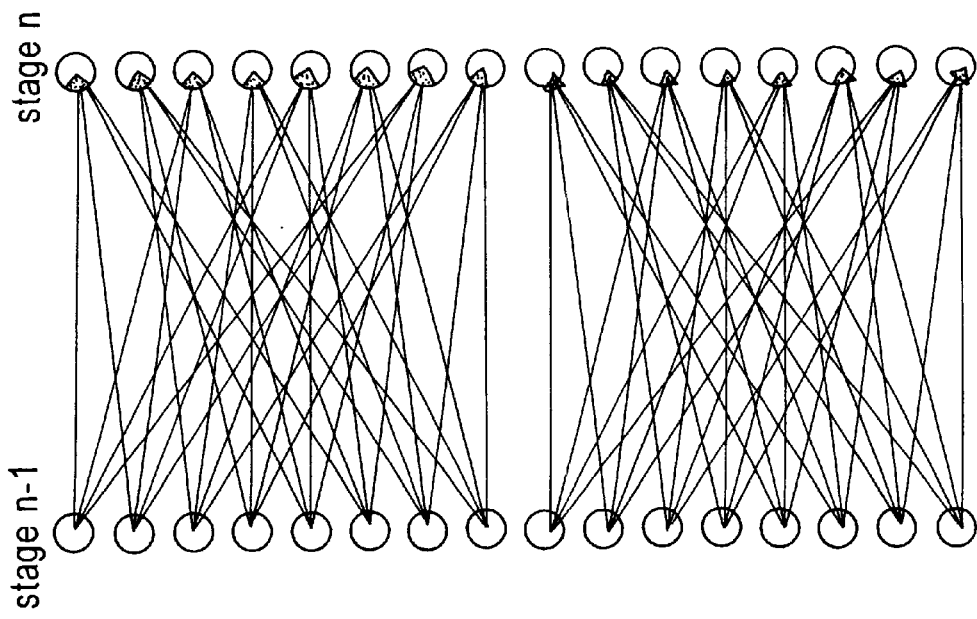
FIG. 12 is a trellis diagram for the equalizers.
Figure 12A:
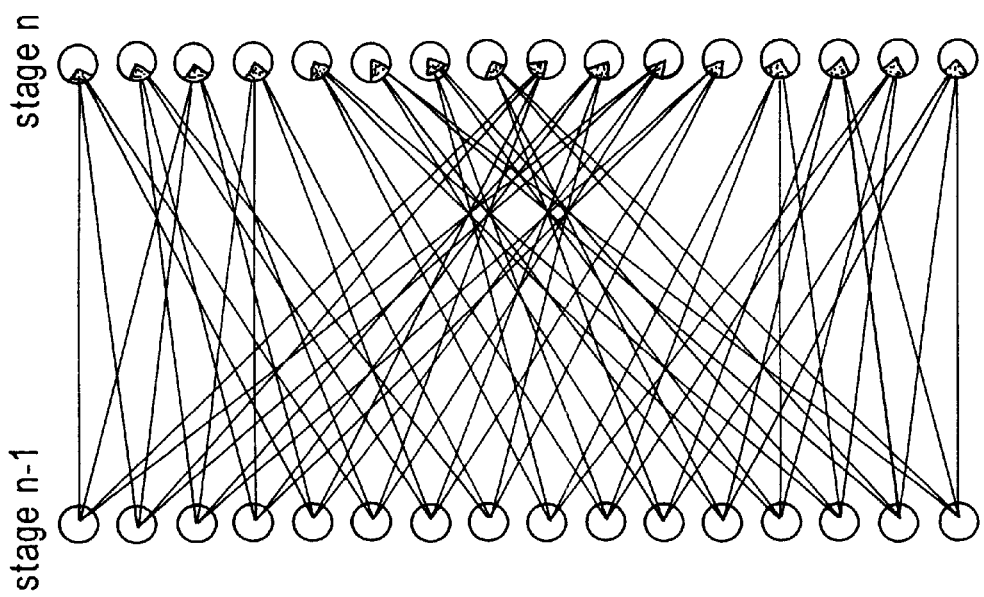

The VA then tracks the paths through the trellis (illustrated in FIG. 12) and provides the solution to the problem of maximum-likelihood estimate of the state sequence. From equation (35) or equation (36), it is clear that the trellis has a maximum of 4Keq states.

There are characteristics that are unique to the trellis of the 2-pulse QMP. For example, there are four allowed transitions from a particular state, such as $S_{I,1}$, to the next state $S_{I,l+1}$. More specifically, the next states are $$S_{I,l+1}^{(1)} = (0, a_{1,l-1}, \ldots, a_{1,l-(K_{eq}-1)}; 0, a_{2,l-1}, \ldots, a_{2,l-(K_{eq}-1)}) \quad (33)$$

$$S_{I,l+1}^{(2)} = (0, a_{1,l-1}, \ldots, a_{1,l-(K_{eq}-1)}; 1, a_{2,l-1}, \ldots, a_{2,l-(K_{eq}-1)}) \quad (34)$$

$$S_{I,l+1}^{(3)} = (1, a_{1,l-1}, \ldots, a_{1,l-(K_{eq}-1)}; 0, a_{2,l-1}, \ldots, a_{2,l-(K_{eq}-1)}) \quad (35)$$

$$S_{I,l+1}^{(4)} = (1, a_{1,l-1}, \ldots, a_{1,l-(K_{eq}-1)}; 1, a_{2,l-1}, \ldots, a_{2,l-(K_{eq}-1)}) \quad (36)$$

In addition, the trellis reaches steady-state and becomes repetitive after the Keq symbol. At steady-state, every state can be reached from four previous states. Continuing the example above, state $S_{I,l}$ results from four likely candidates that are expressed as $$S_{I,l-1}^{(1)} = (a_{1,l-2}, \ldots, a_{1,l-K_{eq}}, 0, a_{2,l-2}, \ldots, a_{2,l-K_{eq}}, 0) \quad (37)$$

$$S_{I,l-1}^{(2)} = (a_{1,l-2}, \ldots, a_{1,l-K_{eq}}, 0, a_{2,l-2}, \ldots, a_{2,l-K_{eq}}, 1) \quad (38)$$

$$S_{I,l-1}^{(3)} = (a_{1,l-2}, \ldots, a_{1,l-K_{eq}}, 1, a_{2,l-2}, \ldots, a_{2,l-K_{eq}}, 0) \quad (37)$$

$$S_{I,l-1}^{(4)} = (a_{1,l-2}, \ldots, a_{1,l-K_{eq}}, 1, a_{2,l-2}, \ldots, a_{2,l-K_{eq}}, 1) \quad (40)$$

As usual, the state $S_{I,l-1}$ is called a survivor state if its associated path that leads to state $S_{I,1}$, has the largest metric among the other three possible candidates. This metric is called the survivor metric and needs to be retained for the next update. This procedure is repeated for every state, so that there is at most one survivor path through each of the 4Keq nodes.

FIG. 13 is a flowchart setting out the operation the efficient MLSE equalizer for QMP in the receiver of FIG. 11.

A modified algorithm, similar to the above, is suitable for a QMP with three pulses. In this situation, the MLSE is implemented in the most efficient way by using the Viterbi algorithm which seeks to find the sequence of information symbols that maximizes the recursive metrics $$J_{I,n}(a_{1,n}, a_{2,n}, a_{3,n}) = J_{I,n-1}(a_{1,n-1}, a_{2,n-1}, a_{3,n-1}) + \quad (41)$$

$$a_{1,n}\Bigg[2x_1(2nT) - R_{11}(0)a_{1,n} -$$

$$2\sum_{m=1}^{k_{eq}} R_{11}(2mT)a_{1,n-m} - R_{12}(0)a_{2,n} -$$

$$2\sum_{m=1}^{K_{eq}} R_{12}(2mT)a_{2,n-m} - R_{13}(0)a_{3,n} -$$

$$2\sum_{m=1}^{K_{eq}} R_{13}(2mT)a_{3,n-m}\Bigg] +$$

$$a_{2,n}\Bigg[2x_2(2nT) - R_{22}(0)a_{2,n} -$$

$$2\sum_{m=1}^{K_{eq}} R_{22}(2mT)a_{2,n-m} - R_{21}(0)a_{1,n} -$$

$$2\sum_{m=1}^{K_{eq}} R_{21}(2mT)a_{1,n-m} - R_{23}(0)a_{3,n} -$$

$$2\sum_{m=1}^{K_{eq}} R_{23}(2mT)a_{3,n-m}\Bigg] +$$

$$a_{3,n}\Bigg[2x_3(2nT) - R_{33}(0)a_{3,n} -$$

$$2\sum_{m=1}^{K_{eq}} R_{33}(2mT)a_{3,n-m} -$$

$$R_{31}(0)a_{1,n} - 2\sum_{m=1}^{K_{eq}} R_{31}(2mT)a_{1,n-m} -$$

$$R_{32}(0)a_{2,n} - 2\sum_{m=1}^{K_{eq}} R_{32}(2mT)a_{2,n-m}\Bigg] \text{ and}$$

-continued $$J_{Q,n}(b_{1,n}, b_{2,n}, b_{3,n}) = J_{Q,n-1}(b_{1,n-1}, b_{2,n-1}, b_{3,n-1}) + \quad (42)$$

$$b_{1,n}\Bigg[2y_1(2nT) - R_{11}(0)b_{1,n} -$$

$$2\sum_{m=1}^{k_{eq}} R_{11}(2mT)b_{1,n-m} - R_{12}(0)b_{2,n} -$$

$$2\sum_{m=1}^{K_{eq}} R_{12}(2mT)b_{2,n-m} - R_{13}(0)b_{3,n} -$$

$$2\sum_{m=1}^{K_{eq}} R_{13}(2mT)b_{3,n-m}\Bigg] +$$

$$b_{2,n}\Bigg[2y_2(2nT) - R_{22}(0)b_{2,n} -$$

$$2\sum_{m=1}^{K_{eq}} R_{22}(2mT)b_{2,n-m} - R_{21}(0)b_{1,n} -$$

$$2\sum_{m=1}^{K_{eq}} R_{21}(2mT)b_{1,n-m} - R_{23}(0)b_{3,n} -$$

$$2\sum_{m=1}^{K_{eq}} R_{23}(2mT)b_{3,n-m}\Bigg] +$$

$$b_{3,n}\Bigg[2y_3(2nT) - R_{33}(0)b_{3,n} -$$

$$2\sum_{m=1}^{K_{eq}} R_{33}(2mT)b_{3,n-m} - R_{31}(0)b_{1,n} -$$

$$2\sum_{m=1}^{K_{eq}} R_{31}(2mT)b_{1,n-m} - R_{32}(0)b_{2,n} -$$

$$2\sum_{m=1}^{K_{eq}} R_{32}(2mT)b_{2,n-m}\Bigg]$$

The $x_1(2kT)$, $x_2(2kT)$ and $x_3(2kT)$ appearing in equation (45) result from passing the in-phase portion of the observation through a filter matched to pulse $p_1(t)$, $P_2(t)$ and $P_3(t)$, respectively, and then sampling the output at the symbol rate of (2T)–1. The factors $y_1(2kT)$, $y_2(2kT)$ and $y_3(2kT)$ in equation (46) result from passing the quadrature portion of the observation through a filter matched to pulses $p_1(t)$, $p_2(t)$ and $p_3(t)$, respectively, and then sampling the output at the symbol rate of (2T)–1.

In the above, there are eight allowed transitions from a particular state. In addition, at steady-state (reached after the $K_{eq}$-th symbol), every state can be reached from eight previous states.

Figure 14:
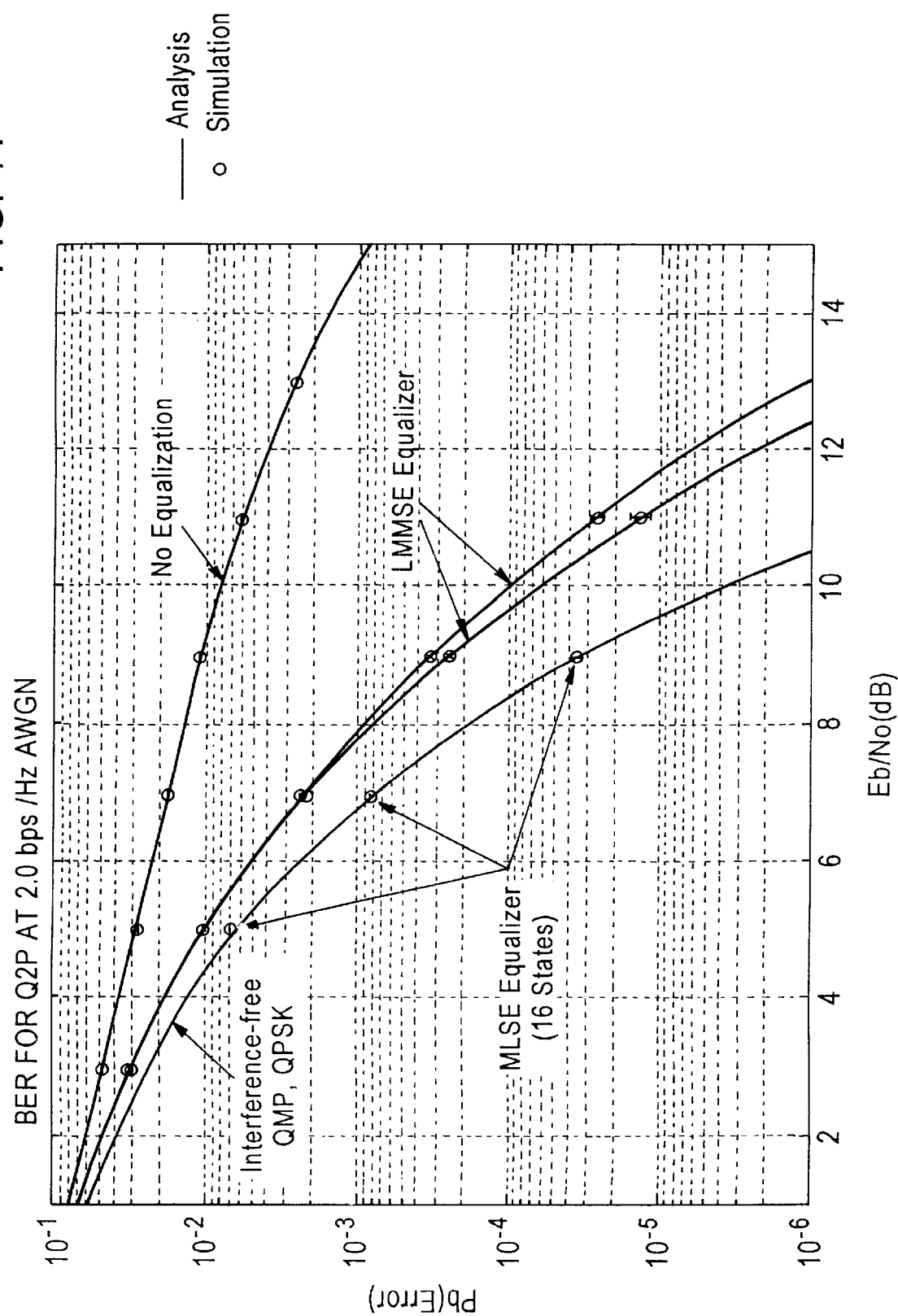

FIG. 14 shows the results for QMP with two pulses. For illustration purposes, the following pair is used:

$$P_1(f) = \left[\frac{4\sqrt{T}}{\pi}\left(\frac{\cos(2\pi fT)}{1 - 16f^2T^2}\right)\right]B_{6,f_{3dB}}(f) \quad (43)$$

$$P_2(f) = \left[\frac{-j16\sqrt{T}}{\pi}\left(\frac{fT\cos(2\pi fT)}{1 - 16f^2T^2}\right)\right]B_{6,f_{3dB}}(f) \quad (44)$$

$$f_{3dB} = \frac{.45}{T}$$

where $B_{n,x}(f)$ is the Butterworth filter of order n and 3-dB cutoff frequency of x HZ. (This pair achieves a spectral efficiency level of 2.00 bits-per-second/Hz based on 99% power containment definition of bandwidth). Other pulse pairs are also possible. For example, in order to achieve 2.46 bits-per-second/Hz in spectral efficiency, the following pair could be used $$P_1(f) = \left[\frac{4\sqrt{T}}{\pi}\left(\frac{\cos(2\pi fT)}{1 - 16f^2T^2}\right)\right]B_{6,f_{3dB}}(f) \quad (45)$$

$$P_2(f) = \left[\frac{-j16\sqrt{T}}{\pi}\left(\frac{fT\cos(2\pi fT)}{1 - 16f^2T^2}\right)\right]B_{6,f_{3dB}}(f) \quad (46)$$

$$f_{3dB} = \frac{1/3}{T}$$

The associated results are shown in FIG. 15. (This level of spectral efficiency is 54% higher than the current cellular of 1.67 bits-per-second/Hz).

For the general case of M-pulse QMP, the efficient implementation of the MLSE equalizer utilizes the following set of recursive equations:

$$J_{I,n}(a_{1,n}, a_{2,n}, \ldots, a_{m,n}) = J_{I,n-1}(a_{1,n-1}, a_{2,n-1}, \ldots, a_{m,n-1}) + \quad (47)$$
$$\sum_{m=1}^{M} a_{m,n}\left[2x_m(2nT) - \sum_{p=1}^{M} R_{mp}(0)a_{p,n} - 2\sum_{p=1}^{M}\sum_{k=1}^{Keq} R_{mp}(2kT)a_{p,n-k}\right]$$

$$J_{Q,n}(b_{1,n}, b_{2,n}, \ldots, b_{m,n}) = J_{Q,n-1}(b_{1,n-1}, b_2, n-1, \ldots, b_{M,n-1}) + \quad (48)$$
$$\sum_{m=1}^{M} b_{m,n}\left[2y_m(2nT) - \sum_{p=1}^{M} R_{mp}(0)b_{p,n} - 2\sum_{p=1}^{M}\sum_{k=1}^{Keq} R_{mp}(2kT)b_{p,n-k}\right]$$

where $x_m(2kt)$ and $y_m(2kt)$ are as defined in equations (10) and (14), respectively.

For comparison, FIGS. 14 and 15 include the performance that results from using a linear minimum mean-square error (LMMSE) equalizer. It attempts to undo ISI and CSI by applying the matched filtering process and then a transversal filter whose coefficients are chosen to minimize the error between the data symbols and their estimates. Both symbol-spaced and fractionally spaced LMMSE equalizers were considered.

It is clear that the efficient MLSE in accordance with this invention is very effective for QMP at high spectral efficiency levels, suffering essentially from no loss in performance compared with the case of ideal non-interfering pulses. This is in marked contrast with the symbol-by-symbol linear minimum mean-square error equalization solution that performed poorly, as evaluated analytically and by simulation.

FIG. 16 contains a trade-off comparison between performance and complexity (in terms of the number of states computed per symbol) for the case of spectral efficiency at 2.46 bits-per-second/Hz. It is apparent that, for the SNR range of interest, the performance enhancements gained by increasing the number of states 4Keq saturates for $K_{eq} \leq 3$. This suggests that good performance at high spectral efficiency with an MLSE equalizer is realizable while keeping the computational complexity at manageable levels.

In addition, the efficiency of the modified VA, in accordance with this invention, stems from the fact that maximizing the in-phase or quadrature likelihood function requires computing N 4Keq instead of 4N metrics for QMP with two pulses and N8Keq instead of 8N for the QMP with three pulses ($K_{eq}$ is typically much smaller than N).

This invention has included examples of pulses that have equal energy. Using the techniques contained herein, however, it is possible to generalize to the case of unequal energy associated with the different pulses. This may be useful in applications where reliability levels assigned with each bit stream is different.

While the present invention has been described herein with reference to specific examples, those examples are intended to be illustrative only, and are not to be deemed to limit the scope of the invention. To the contrary, it will be apparent to those of ordinary skill in the art that many changes, additions and/or deletions may be made to the disclosed embodiments without departing from the scope and spirit of the invention. In particular, the present invention and its performance have been described primarily in association with the customary additive white Gaussian noise (AWGN) channel. As is well-known, maximum likelihood sequence estimation algorithms for the AWGN are readily adapted to fading channels, non-frequency-selective or frequency-selective, either in substantially the same form or by estimating the channel directly and incorporating channel parameters into the path metrics. Such modifications would be clear to those of ordinary skill in the art.

What is claimed is:

1. The combination of a modulator and a demodulator comprising:

a modulator, said modulator modulating, during a series of signaling intervals, at least three data signals, each including a digital value for each signaling interval, the modulator comprising developing means for developing, for each data signal, a pulse of a predetermined shape, and combining means for combining the pulses and the data signals for form a single combined signal including, in each signaling interval, signal components bases on the pulses and on a digital value from each data signal, at least two of the signal components overlapping in time and in frequency;

a demodulator comprising a receiving means for receiving the modulated signal, and demodulating means coupled to the receiving means for demodulating the modulated signal and determining a digital value for each of at least one of the signals using a weighted integration of the corresponding one of said pulses; and modulating means for modulating the combined signal onto a carrier frequency to thereby form a modulated signal, wherein the carrier frequency comprises first and second carrier components which are substantially orthogonal to one another, and wherein the modulating means modulates respective first and second portions of the combined signal onto each of the first and second carrier frequencies, and wherein the developing means develops a pulse of a predetermined shape for each of at least six data signals, and wherein the combining means forms each of the first and second portions of the combined signal based on at least three of the pulses and on the digital values of the at least three of the data signals.

2. The combination of claim 1, wherein the demodulating means determines all of the digital values.

3. The combination of claim 1, wherein the demodulating means comprises means for removing the carrier signal from the modulated signal to thereby recover the combined signal.

4. The combination of claim 3, wherein the demodulating means further comprises a filter substantially matched to one of the pulses to perform said weighted integration.

5. The combination of claim 3, wherein the demodulating means further comprises a filter corresponding to each pulse, wherein each filter is substantially matched to the pulse to which it corresponds to perform said weighted integration.

6. The combination of claim 5, wherein the demodulating means further comprises a sampler coupled to each of the filters.

7. The combination of claim 1, wherein the demodulating means comprises a decision block.

\* \* \* \* \*